United States Patent
Ando et al.

(10) Patent No.: US 11,105,023 B2
(45) Date of Patent: Aug. 31, 2021

(54) ANTIBACTERIAL NONWOVEN MEMBER, ANTIBACTERIAL NONWOVEN FABRIC, AND ANTIBACTERIAL BUFFER MATERIAL

(71) Applicant: Murata Manufacturing Co., Ltd., Nagaokakyo (JP)

(72) Inventors: Masamichi Ando, Nagaokakyo (JP); Satoshi Ishino, Nagaokakyo (JP)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 130 days.

(21) Appl. No.: 16/040,679

(22) Filed: Jul. 20, 2018

(65) Prior Publication Data

US 2018/0355525 A1    Dec. 13, 2018

Related U.S. Application Data

(63) Continuation of application No. PCT/JP2017/038613, filed on Oct. 26, 2017.

(30) Foreign Application Priority Data

Nov. 1, 2016  (JP) .............................. JP2016-214425
Jun. 8, 2017  (JP) .............................. JP2017-113312

(51) Int. Cl.
| | | |
|---|---|---|
| *D03D 15/00* | (2006.01) | |
| *D03D 15/40* | (2021.01) | |
| *D01D 5/04* | (2006.01) | |
| *D01D 5/06* | (2006.01) | |
| *D02G 3/22* | (2006.01) | |

(Continued)

(52) U.S. Cl.
CPC ............. *D03D 15/497* (2021.01); *D01D 5/04* (2013.01); *D01D 5/06* (2013.01); *D02G 3/22* (2013.01); *D04H 1/02* (2013.01); *D04H 1/42* (2013.01); *D04H 1/435* (2013.01); *D10B 2401/13* (2013.01); *D10B 2401/16* (2013.01)

(58) Field of Classification Search
CPC ..................................................... D03D 15/00
See application file for complete search history.

(56) References Cited

U.S. PATENT DOCUMENTS 3,798,474 A * 3/1974 Cassand .................... G01L 9/08
                                                                310/331
5,031,162 A    7/1991 Morimoto et al.
(Continued)

FOREIGN PATENT DOCUMENTS

DE    202005021245 U1    6/2007
EP         3467169 A1    4/2019
(Continued)

OTHER PUBLICATIONS

Definition of "nonwoven fabric" Complete Textile Glossary, Celanese Acetate, copyright 2001. (Year: 2001).*
(Continued)

*Primary Examiner* — Andrew T Piziali
(74) *Attorney, Agent, or Firm* — Arent Fox LLP

(57) ABSTRACT

A nonwoven member that includes a plurality of piezoelectric fibers. The nonwoven member is formed into a cloth by intertwining the plurality of piezoelectric fibers. The nonwoven member inhibits the growth of bacteria due to an electric charge generated when an external force is applied to the piezoelectric fibers.

16 Claims, 19 Drawing Sheets

(51) Int. Cl.
- *D04H 1/02* (2006.01)
- *D04H 1/42* (2012.01)
- *D04H 1/435* (2012.01)

(56) References Cited

U.S. PATENT DOCUMENTS

| | | | |
|---|---|---|---|
| 6,494,921 B1* | 12/2002 | Bennett | D06F 35/00 8/137 |
| 9,090,995 B2 | 7/2015 | Imashiro et al. | |
| 2006/0150818 A1* | 7/2006 | Okamoto | B03C 3/155 96/223 |
| 2008/0307899 A1 | 12/2008 | Von Lilienfeld-Toal et al. | |
| 2010/0120315 A1 | 5/2010 | Imashiro et al. | |
| 2013/0082424 A1 | 4/2013 | Imashiro et al. | |
| 2014/0134418 A1* | 5/2014 | Lee | H01L 41/183 428/220 |
| 2015/0280102 A1* | 10/2015 | Tajitsu | H01L 41/082 310/338 |
| 2016/0190427 A1 | 6/2016 | Kim et al. | |
| 2017/0029985 A1 | 2/2017 | Tajitsu et al. | |
| 2018/0108826 A1* | 4/2018 | Tajitsu | H01L 41/082 |
| 2018/0151795 A1 | 5/2018 | Cobanoglu et al. | |
| 2018/0358541 A1 | 12/2018 | Tajitsu et al. | |

FOREIGN PATENT DOCUMENTS

| | | |
|---|---|---|
| GB | 2 516 987 A | 2/2015 |
| JP | S51132986 A | 11/1976 |
| JP | S60151386 A | 8/1985 |
| JP | H07310284 A | 11/1995 |
| JP | H08226078 A | 9/1996 |
| JP | H09194304 A | 7/1997 |
| JP | 3025272 B2 | 3/2000 |
| JP | 2000144545 A | 5/2000 |
| JP | 2000239969 A | 9/2000 |
| JP | 3165992 B2 | 5/2001 |
| JP | 2001254270 A | 9/2001 |
| JP | 3281640 B2 | 5/2002 |
| JP | 2002242061 A | 8/2002 |
| JP | 2003027371 A | 1/2003 |
| JP | 2004300650 A | 10/2004 |
| JP | 2009516839 A | 4/2009 |
| JP | 2011086114 A | 4/2011 |
| JP | 2011200295 A | 10/2011 |
| JP | 2013124424 A | 6/2013 |
| JP | 2014033478 A | 2/2014 |
| JP | 2015204429 A | 11/2015 |
| JP | 2016127202 A | 7/2016 |
| JP | 2016213267 A | 12/2016 |
| JP | 2017183432 A | 10/2017 |
| WO | 2008123345 A1 | 10/2008 |
| WO | 2014161920 A1 | 10/2014 |
| WO | 2015159832 A1 | 10/2015 |
| WO | 2017115860 A1 | 7/2017 |

OTHER PUBLICATIONS

Microorganism Control—Science and Engineering published by Kodansha Ltd, Copyright T. Tsuchido, H. Kourai, H. Matsuoka, J. Koizumi, 2002; "Electrical Control" Section 4.1.3, p. 50 (Translation of section 4.1.3, p. 50).
Takaki, Koichi; "Agricultural and Food Processing Applications of High-Voltage and Plasma Technologies"; J. HTSJ, vol. 51, No. 216, Jul. 2012, pp. 64-69. (Translation of Section 5 p. 67 "Freshness retention and component extraction by high voltage").
International Search Report issued in PCT/JP2017/038613, dated Jan. 16, 2018.
Written Opinion of the International Searching Authority issued in PCT/JP2017/038613, dated Jan. 16, 2018.
International Search Report issued for PCT/JP2017/017237, dated Jul. 25, 2017.
Written Opinion of the International Searching Authority issued for PCT/JP2017/017237, dated Jul. 25, 2017.
Fukada, E.; "Piezoelectricity of Biopolymers", Polymer vol. 16 (1967), No. 9, pp. 795-800. (Translation of abstract only).

* cited by examiner

ANTIBACTERIAL NONWOVEN MEMBER, ANTIBACTERIAL NONWOVEN FABRIC, AND ANTIBACTERIAL BUFFER MATERIAL

CROSS REFERENCE TO RELATED APPLICATIONS

The present application is a continuation of International application No. PCT/JP2017/038613, filed Oct. 26, 2017, which claims priority to Japanese Patent Application No. 2016-214425, filed Nov. 1, 2016, and Japanese Patent Application No. 2017-113312, filed Jun. 8, 2017, the entire contents of each of which are incorporated herein by reference.

FIELD OF THE INVENTION

The present invention relates to an antibacterial nonwoven member, a nonwoven fabric using the nonwoven member, and a buffer material using the nonwoven member.

BACKGROUND OF THE INVENTION

Conventionally, many proposals have been made on an antibacterial nonwoven fabric and a cushioning material (hereinafter referred to as buffer material) (see Patent Documents 1 to 4).

Patent Document 1: Japanese Patent Application Laid-Open No. 2003-27371

Patent Document 2: Japanese Registered Utility Model No. 3025272

Patent Document 3: Japanese Patent Application Laid-Open No. 2001-254270

Patent Document 4: Japanese Patent Application Laid-Open No. 2011-200295

SUMMARY OF THE INVENTION

Antibacterial materials used in nonwoven fabrics or the like, however, may fail to keep excellent antibacterial action for a long time.

Further, the antibacterial materials may cause an allergic reaction due to chemicals or the like.

An object of the present invention is to provide an antibacterial nonwoven member, an antibacterial nonwoven fabric, and an antibacterial buffer material which keep an antibacterial effect longer than conventional antibacterial materials and are more excellent in safety than chemicals or the like.

The antibacterial nonwoven member according to an aspect of the present invention includes a plurality of piezoelectric bodies configured to inhibit growth of bacteria as a result of electric charges generated when an external force is applied to the plurality of piezoelectric bodies.

Conventionally, it has been known that an electric field can inhibit the growth of bacteria (see, for example, "Biseibutsu Seigyo—Kagaku to Kougaku" (microbiological control—science and engineering) authored by Tetsuaki TSUCHIDO, Hiroki KOURAI, Hideaki MATSUOKA, and Junichi KOIZUMI, published by Kodansha Scientific Ltd. See also, for example, "Agricultural and Food Processing Applications of High-Voltage and Plasma Technologies" written by Koichi TAKAKI, J. HTSJ, Vol. 51, No. 216). A potential which produces the electric field may cause an electric current to flow in a current path formed due to humidity or the like, or in a circuit formed through a local phenomenon of microdischarge. The electric current may partially destroy cell membranes of bacteria to inhibit the growth of bacteria. The antibacterial nonwoven member according to an aspect of the present invention locally produces an electric field inside the nonwoven member due to electric charges generated when an external force is applied to the piezoelectric bodies. When it comes close to an object having a given potential (including a ground potential) such as a human body, an electric field is produced between the nonwoven member and the object. Alternatively, the antibacterial nonwoven member according to an aspect of the present invention allows an electric current to locally flow inside the nonwoven member through moisture such as perspiration. When it comes close to an object having a given potential (including a ground potential) such as a human body, an electric current is flown between the nonwoven member and the object. Therefore, the antibacterial nonwoven member according to aspects of the present invention damage cell membranes of bacteria or an electron transfer system for maintaining bacteria life to thereby kill bacteria or weaken bacteria themselves due to a direct action of the electric field or current that is locally produced in the member, or due to a direct action of the electric field or current that is produced when applied to an object (clothes, hygienic materials, cushioning materials, etc.) used close to an object having a given potential such as a human body. Further, the electric field or current may convert oxygen contained in moisture into active oxygen species, or stress environment caused by the presence of the electric field or current may produce oxygen radicals in cells of bacteria. The action of the active oxygen species including these radicals can kill bacteria or weaken bacteria themselves. In addition, an antibacterial effect (effect of inhibiting the growth of bacteria) and a sterilizing effect may be produced in combination of the above reasons.

Since the nonwoven member according to aspects of the present invention produces an electric field by a piezoelectric effect, no power supply is required, and an electric shock may not occur. The life of the piezoelectric body lasts longer than the antibacterial effect of chemicals or the like. Further, the piezoelectric body is less likely to cause an allergic reaction as compared to chemicals.

Preferably, the plurality of piezoelectric bodies may be a piezoelectric polymer.

The piezoelectric polymer may also contain polylactic acid.

The antibacterial nonwoven member according to a further of the present invention includes a mass containing a piezoelectric body which is configured to inhibit growth of bacteria as a result of an electric charge generated when an external force is applied to the piezoelectric body.

The antibacterial nonwoven member according to aspects of the present invention produces an electric field between the piezoelectric bodies due to electric charges generated when an external force is applied to the piezoelectric bodies. Alternatively, the antibacterial nonwoven member according to aspects of the present invention produces an electric field when it comes close to an object having a given potential (including a ground potential) such as a human body. Therefore, the antibacterial nonwoven member exerts an antibacterial effect (effect of inhibiting the growth of bacteria) due to an electric field generated when applied to clothes, hygienic materials, various mats, various cushioning materials, or the like, or due to an electric current that locally flows.

Since the nonwoven member according to aspects of the present invention produces an electric field by a piezoelectric effect, no power supply is required, and an electric shock may not occur. The life of the piezoelectric body lasts longer than the antibacterial effect of chemicals or the like. Further, the piezoelectric body may cause an allergic reaction less than chemicals. It also has an extremely low possibility of generating resistant bacteria.

Preferably, the mass may have a ribbon film made from the piezoelectric body or a yarn made from the piezoelectric body.

More preferably, the mass has a plurality of the ribbon films, and a molecular orientation direction of one of the plurality of ribbon films is preferably different from that of the other ribbon film having a random angle to the longitudinal direction. This configuration allows an antibacterial effect and a sterilizing effect to be uniformly exerted on an external force in any direction applied from outside.

The mass may also partially have a plurality of the ribbon films or a cloth woven of a plurality of the yarns.

It is preferable that the mass partially has a cloth woven of the plurality of yarns; the piezoelectric body has a first piezoelectric body and a second piezoelectric body; the plurality of yarns have a first yarn made from the first piezoelectric body and a second yarn made from the second piezoelectric body; and the cloth is woven of the first yarn and the second yarn, the first yarn generating a positive electric charge when an external force is applied and the second yarn generating a negative electric charge when an external force is applied. This configuration allows the cloth to solely produce an electric field, thereby producing an antibacterial effect.

The first yarn and the second yarn may also be arranged in parallel. The strength of the electric field increases in inversely proportion to the distance between substances which generate electric charges. This configuration allows the distance between the first and second yarns to be reduced, which enables the strength of the electric field generated by the cloth to be extremely large. Therefore, it is possible for the cloth to exhibit a high antibacterial action.

The first yarn and the second yarn may be arranged in crossed relation.

The plurality of yarns may also have a third yarn formed by interlacing the first yarn and the second yarn as a braid.

The piezoelectric body may also be a piezoelectric polymer.

The piezoelectric body is preferably a piezoelectric polymer and the yarn may be obtained by twisting the piezoelectric polymer.

The piezoelectric polymer may contain polylactic acid.

A nonwoven fabric according to an aspect of the present invention is formed of any of the antibacterial nonwoven members described above and in a cloth form.

A buffer material according to an aspect of the present invention is formed of any of the antibacterial nonwoven members described above.

The present invention can achieve an antibacterial nonwoven member, an antibacterial nonwoven fabric, and an antibacterial buffer material which keep an antibacterial effect longer than conventional antibacterial materials and are safer than chemicals or the like.

DETAILED DESCRIPTION OF THE INVENTION

Hereinafter, a plurality of embodiments for carrying out the invention will be described by way of some specific examples with reference to the accompanying drawings. The same parts are assigned the same reference symbols in all figures. In consideration of description of major points or easy understanding, embodiments are separately shown for convenience. It is, however, possible to partially replace or combine with configurations shown in different embodiments. In the second and subsequent embodiments, the description common to the first embodiment will be omitted and only different points will be described. In particular, the similar operation and effect by the similar configuration will not be described in each embodiment.

Although some examples are shown in the subsequent embodiments, the "nonwoven member" as used herein is a nonwoven member including a piezoelectric body, and examples thereof include nonwoven fabric or buffer material (wadding, cushioning material, pellet, mat, etc.).

Further, the "nonwoven member" in the present invention can be used as a nonwoven fabric or a buffer material in any applications requiring antibacterial and antifungal properties. The "nonwoven member" that may be used includes, for example, clothes (inner or insole for clothing, underwear, headwear, shoes, boots, etc.), sporting goods (inner materials for wear and gloves, gloves used for martial arts), kitchenware (sponge, dish towel), hygienic materials (mask, bandage, gauze, supporter), commodities (curtain, toilet seat sheet), sanitary supplies, various filters (water purifier, air conditioner, air purifier), various mats (for foot, for toilet), cushion members (seat for cars, electric cars, or airplanes, buffer material and exterior material for motorcycle helmets, sofa, pillow, futon, mattress, stuffed toy), pet goods (mat for pets, inner for pet clothing), and packaging materials (packing pellet, packing mat).

First Embodiment

Figure 1A:
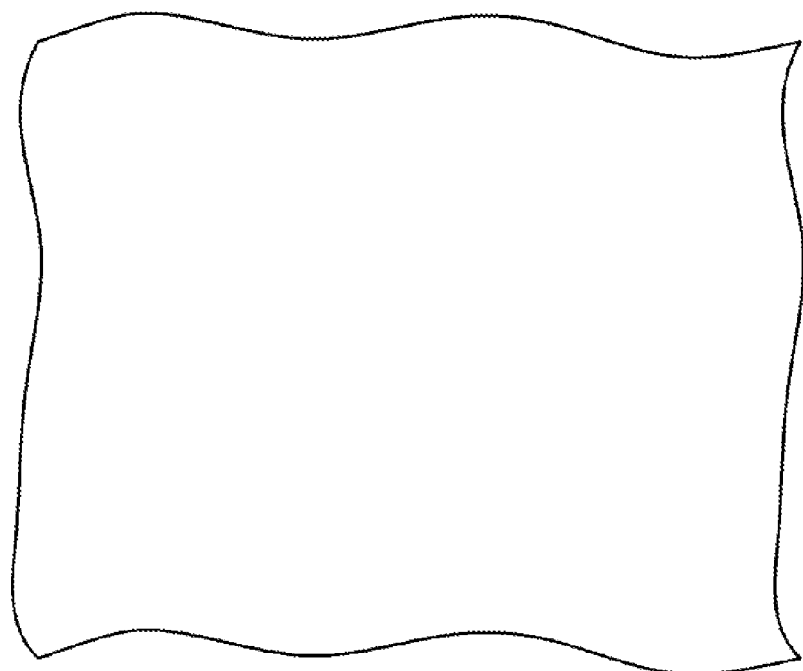
FIG. 1A is a schematic plan view of a nonwoven member 101 according to a first embodiment.
Figure 1B:
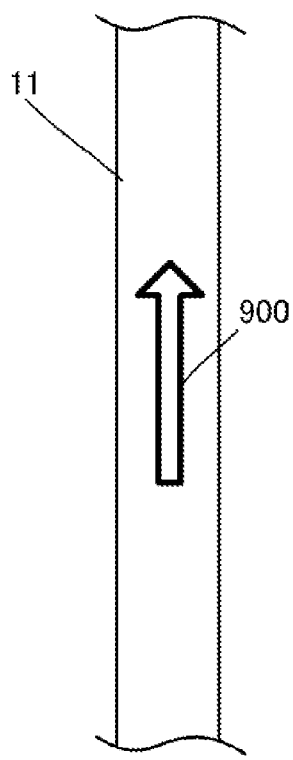
FIG. 1B is a plan view of a piezoelectric fiber 11 forming the nonwoven member 101.

FIG. 1A is a schematic plan view of a nonwoven member 101 according to a first embodiment, and FIG. 1B is a plan view of a piezoelectric fiber 11 forming the nonwoven member 101. The nonwoven member 101 is a nonwoven fabric. The nonwoven fabric is an example of the "nonwoven member" in the present invention.

The nonwoven member 101 includes a plurality of piezoelectric fibers 11. The nonwoven member 101 of the present embodiment is formed into a cloth (sheet) by intertwining the plurality of piezoelectric fibers 11. The piezoelectric fiber 11 is an example of the "piezoelectric body" in the present invention.

The piezoelectric fiber 11 is made of, for example, a piezoelectric polymer. Some of the piezoelectric fibers 11 are pyroelectric and some are not. For example, polyvinylidene fluoride (PVDF) is pyroelectric and generates an electric charge due to temperature change. Polylactic acid (PLA) is a piezoelectric body not having pyroelectricity. Polylactic acid is uniaxially stretched to have piezoelectric properties. Polylactic acid includes PLLA in which an L-form monomer is polymerized, and PDLA in which a D-form monomer is polymerized.

A chiral polymer such as polylactic acid has a spiral structure in its main chain. The chiral polymer has piezoelectric properties when molecules are oriented by uniaxially stretching. The piezoelectric fiber 11 made of uniaxially stretched polylactic acid has $d_{14}$ and $d_{25}$ tensor components as piezoelectric strain constants when the thickness direction of the piezoelectric fiber 11 is defined as a first axis, the stretching direction 900 thereof is defined as a third axis, and a direction perpendicular to both the first and third axes is defined as a second axis. Accordingly, polylactic acid generates an electric charge when a strain occurs in a direction at an angle of 45° to the uniaxially stretching direction.

Figure 2A:
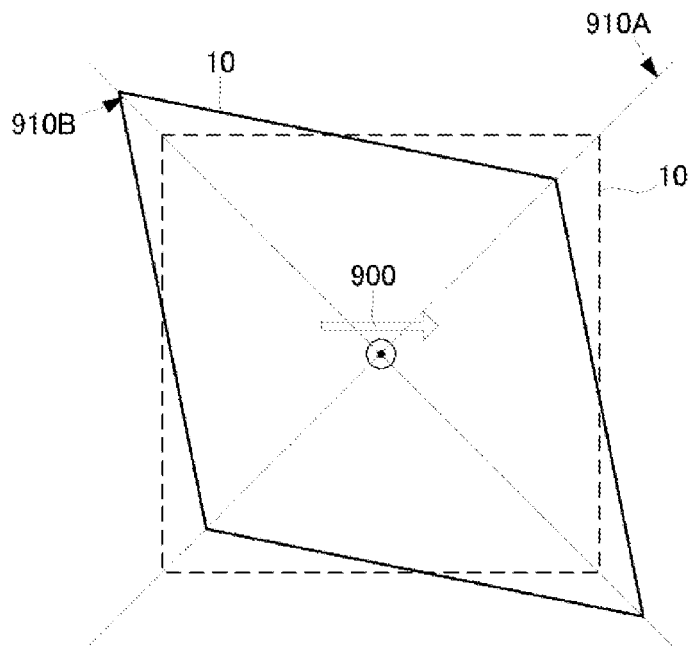
FIG. 2A and FIG. 2B are views showing a relationship of a uniaxially stretching direction of polylactic acid, an electric field direction, and deformation of a piezoelectric film 10.
Figure 2B:
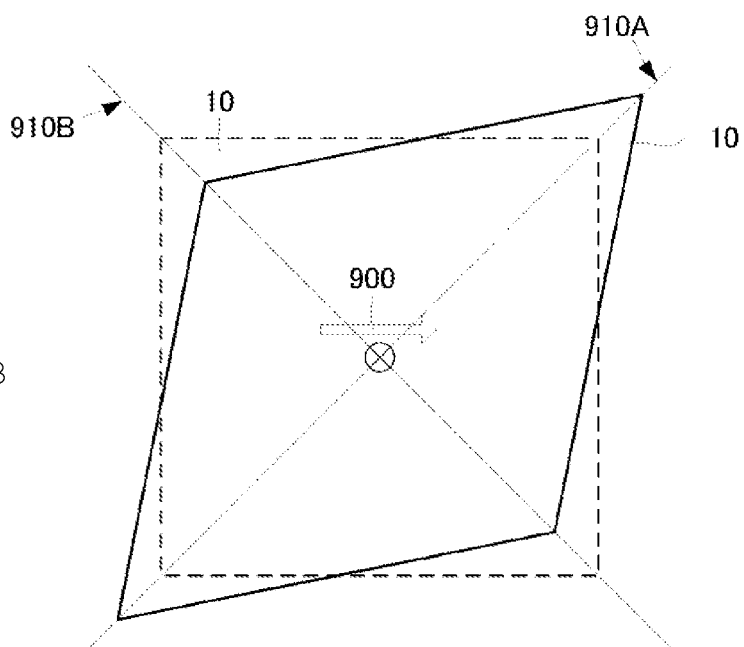

FIG. 2A and FIG. 2B are views showing a relationship of a uniaxially stretching direction of polylactic acid, an electric field direction, and deformation of a piezoelectric film 10.

As shown in FIG. 2A, when the piezoelectric film 10 shrinks in a direction of a first diagonal line 910A and stretches in a direction of a second diagonal line 910B perpendicular to the first diagonal line 910A, an electric field is produced in a direction from the back plane to the front plane of the paper. That is, the piezoelectric film 10 generates a negative electric charge on the front plane of the paper. As shown in FIG. 2B, even when the piezoelectric film 10 stretches in the first diagonal line 910A and shrinks in the second diagonal line 910B, an electric charge is generated, but the polarity is reversed, and an electric field is produced in a direction from the front plane to the back plane of the paper. That is, the piezoelectric film 10 generates a positive electric charge on the front plane of the page.

Since polylactic acid generates the piezoelectric properties due to molecular orientation processing by stretching, it does not need to be subjected to polling processing as do other piezoelectric polymers such as PVDF or piezoelectric ceramic. The uniaxially-stretched polylactic acid has a piezoelectric constant of approximately 5 to 30 pC/N, which is an extremely high piezoelectric constant among polymers. Further, the piezoelectric constant of the polylactic acid does not vary with time and is extremely stable.

The piezoelectric fiber 11 is a ribbon film made of polylactic acid having a flat elongated shape. As shown in FIG. 1B, the stretching direction 900 of the piezoelectric fiber 11 is oriented in the same direction as the longitudinal direction. Therefore, when shear stress is applied to the longitudinal direction of the piezoelectric fiber 11, the piezoelectric fiber 11 becomes in a state shown in FIG. 2A or 2B and an electric charge of a polarity corresponding to the deformation of the surface is generated. Therefore, when a tension or the like is applied from outside to the nonwoven member 101 having a sheet shape formed by intertwining the plurality of piezoelectric fibers 11, sliding deformation occurs in the piezoelectric fiber 11 (among the plurality of piezoelectric fibers 11, other than those of which the stretching direction is at an angle of 0° or 90° to the direction of the above-mentioned tension or the like) due to shear stress, which in turn generates a voltage. The voltage thus generated produces electric fields between the plurality of piezoelectric fibers 11. In addition, when the plurality of piezoelectric fibers 11 come close to an object having a given potential (including a ground potential) such as a human body, an electric field is produced between the piezoelectric fibers and the object.

Figure 3:
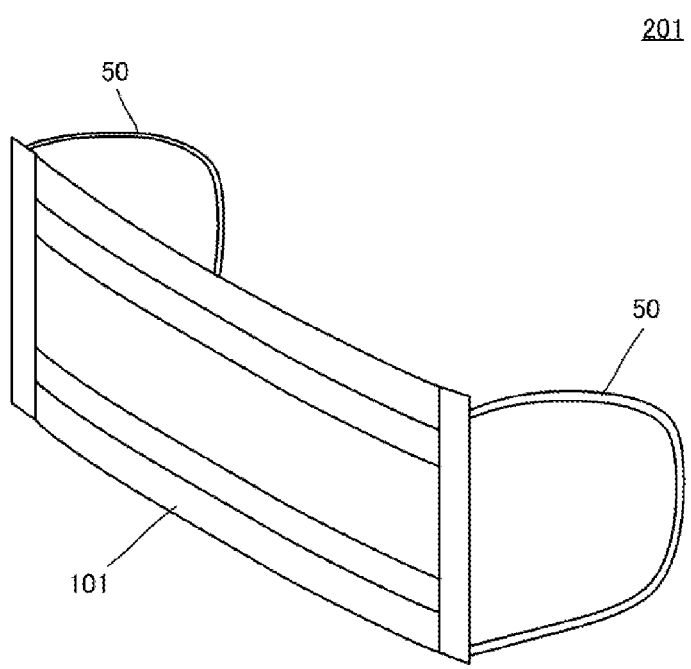
FIG. 3 is an outline view of a mask 201 including the nonwoven member 101.

FIG. 3 is an outline view of a mask 201 including the nonwoven member 101. As shown in FIG. 3, the mask 201 includes the nonwoven member 101 and straps 50.

In the nonwoven member 101, the plurality of piezoelectric fibers 11 having a predetermined length are contained so that their longitudinal directions are at random angles. The plurality of piezoelectric fibers 11 are close to or overlapped with each other at a plurality of positions in the nonwoven member 101. The piezoelectric fiber 11 has a width of, for example, approximately 0.01 mm to 1 mm and a thickness of, for example, approximately 0.005 to 0.1 mm. The piezoelectric fiber 11 also has a length of, for example, approximately 0.5 mm to 100 mm. These dimensions are design matters to be determined by a method of manufacturing the piezoelectric fiber 11 and are not limited thereto. The piezoelectric fiber 11 is made from a film obtained by stretching through a slit process. A piezoelectric polylactic film is generally made by longitudinally uniaxial stretching or transversely uniaxial stretching. The molecule of the piezoelectric polylactic film is oriented along the stretching direction. When each film is cut out from a raw film during the slit process, a film is cut into a ribbon piece at an angle larger than 0° and smaller than 90° relative to the molecular oriented direction (preferably an angle of 45° relative to the molecular oriented direction), so that the ribbon film thus cut out generates an electric charge by stretching in the longitudinal direction. The piezoelectric fiber 11 may be such a ribbon film. A plurality of ribbon films thus cut out at any angle including 0° and 90° relative to the molecular oriented direction may be used as the piezoelectric fiber 11. That is, the molecular orientation direction of the plurality of piezoelectric fibers 11 may be at random angles to the longitudinal direction. In this case, the piezoelectric fibers 11 that are cut out at any angle relative to the molecular oriented direction are present in the nonwoven member 101. Therefore, among the plurality of piezoelectric fibers 11, a piezoelectric fiber 11 where sliding deformation occurs due to an external force applied from outside effectively generates an electric charge. Accordingly, this configuration allows an effect described below to be uniformly exerted on an external force in any direction applied from outside.

Conventionally, there has been known that an electric field can inhibit the growth of bacteria (see, for example, "Biseibutsu Seigyo—Kagaku to Kougaku" (microbiological control—science and engineering) authored by Tetsuaki TSUCHIDO, Hiroki KOURAI, Hideaki MATSUOKA, and Junichi KOIZUMI, published by Kodansha Scientific Ltd. See also, for example, "Agricultural and Food Processing Applications of High-Voltage and Plasma Technologies" written by Koichi TAKAKI, J. HTSJ, Vol. 51, No. 216). A potential which produces the electric field may cause an electric current to flow in a current path formed due to humidity or the like, or in a circuit formed through a local phenomenon of microdischarge. The electric field or current may convert oxygen contained in moisture into active oxygen species, or stress environment caused by the presence of the electric field or current may produce oxygen radicals in cells of bacteria. The action of the active oxygen species including these radicals can kill bacteria or weaken the bacteria themselves. In addition, an antibacterial effect (effect of inhibiting the growth of bacteria) and a sterilizing effect may be produced in combination of the above reasons. The electric current may partially destroy cell membranes of bacteria to inhibit the growth of bacteria. The bacteria as used in this embodiment include germs, fungi, or microorganism such as mites, fleas, or the like.

When the mask 201 is worn, the mask 201 is bent due to the movement by breathing, conversation, and the like at a high frequency, and such bending causes the nonwoven member 101 to be stretched. This produces voltages on the plurality of piezoelectric fibers 11 in the nonwoven member 101 and the electric field is generated between the plurality of the piezoelectric fibers 11. Further, since the mask 201 is positioned close to a human body (skin), when an external force is applied to the nonwoven member 101 in the mask 201, an electric field is generated between the human body and the nonwoven member 101. Therefore, the electric field generated in the nonwoven member 101 or the electric field generated between the human body and the nonwoven member 101 directly exerts an antibacterial effect and an antifungal effect. In addition, the mask absorbs breathing, perspiration or moisture in the air to become a hotbed for growth of bacteria. The nonwoven member 101 is, however, capable of inhibiting the growth of bacteria and thus produces a remarkable effect as applications for antibacterial measure and measure against odor.

As described above, the piezoelectric fiber 11 generates a positive or negative electric charge when an external force is applied. This causes the piezoelectric fiber 11 to attract a substance having a positive electric charge (e.g., particles such as pollen) or a substance having a negative electric charge (e.g., harmful substances such as yellow dust). Therefore, it is possible for the mask 201 to attract fine particles such as pollen or yellow dust with the nonwoven member 101 including the piezoelectric fibers 11.

Second Embodiment

The second embodiment shows an example in which the nonwoven member of the present invention is a buffer material.

Figure 4A:
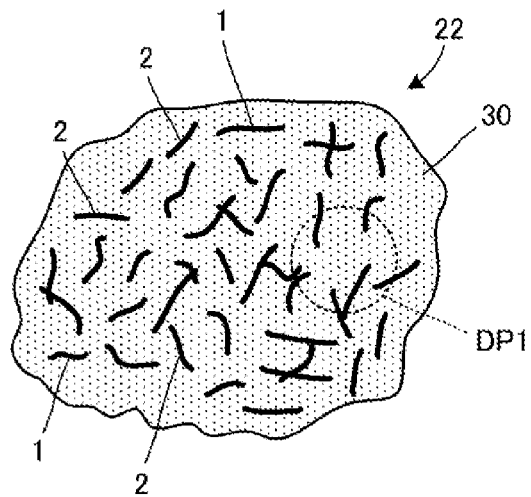
FIG. 4A is an outline view of a nonwoven member 102 according to a second embodiment and FIG. 4B is an enlarged view of a DP1 portion shown in FIG. 4A.
Figure 4B:
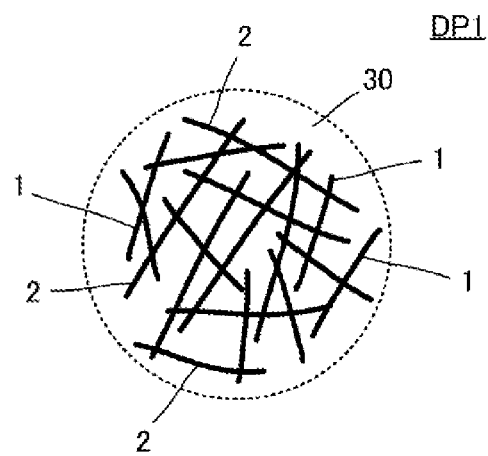

FIG. 4A is an outline view of a nonwoven member 102 according to a second embodiment and FIG. 4B is an enlarged view of a DP1 portion shown in FIG. 4A.

The nonwoven member 102 includes a mass 22 containing a piezoelectric body. The mass 22 is composed of a piezoelectric yarn 1, a piezoelectric yarn 2, and a cotton 30. The mass 22 is a cushioning material obtained by mixing the piezoelectric yarns 1 and 2 with the cotton 30 as shown in FIG. 4B. The nonwoven member 102 according to this embodiment is a cushioning material to be used in, for example, a cushion.

Figure 5A:
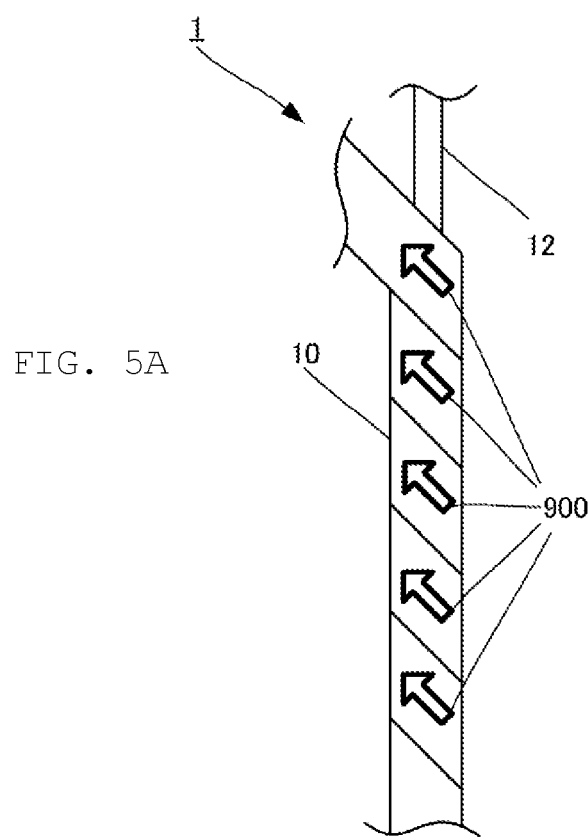
FIG. 5A is a partially exploded view showing a configuration of a piezoelectric yarn 1 and FIG. 5B is a partially exploded view showing a configuration of a piezoelectric yarn 2.
Figure 5B:
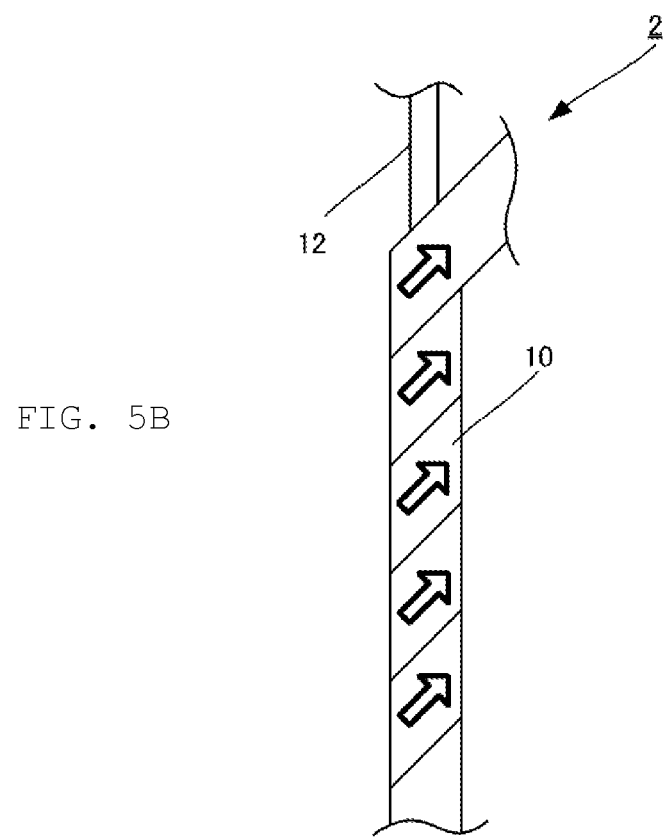
Figure 6:
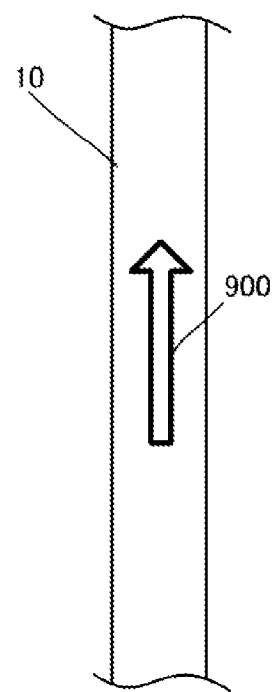
FIG. 6 is a plan view of the piezoelectric film 10.

FIG. 5A is a partially exploded view showing a configuration of a piezoelectric yarn 1 and FIG. 5B is a partially exploded view showing a configuration of a piezoelectric yarn 2. FIG. 6 is a plan view of the piezoelectric film 10.

Each of the piezoelectric yarns 1 and 2 is made by winding the piezoelectric film 10 around a core yarn 12. The piezoelectric film 10 is an example of the "piezoelectric body" in the present application. The core yarn 12 is appropriately selected from cotton, silk, general synthetic fiber, or the like. The core yarn 12 may be a conductive yarn having electrical conductivity. In the case of using a conductive yarn as the core yarn 12, when the piezoelectric properties of the piezoelectric yarn are checked, an electric charge generated on the piezoelectric yarn 1 (or piezoelectric yarn 2) can be measured using an electrode formed on a part of the outer region of the piezoelectric yarn 1 (or piezoelectric yarn 2) and the core yarn 12. This allows the piezoelectric performance of the piezoelectric film 10 that is used on the piezoelectric yarns 1 and 2 to be checked. Further, the conductive yarns are short-circuited to each other to thereby clearly form a circuit among the yarns, so that an electric field generated between the surfaces of the yarns is remarkably increased. The piezoelectric film 10 is made of, for example, uniaxially stretched polylactic acid.

Figure 7A:
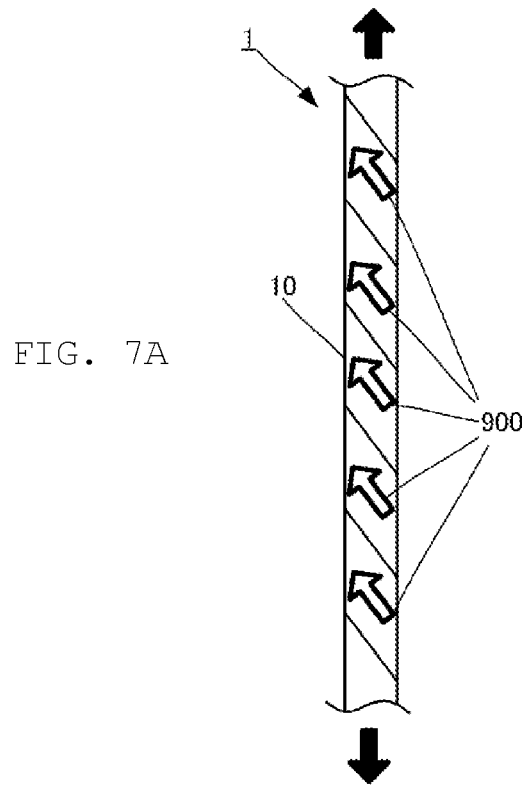
FIG. 7A is a view showing the piezoelectric yarn 1 when an external force is applied.
Figure 7B:
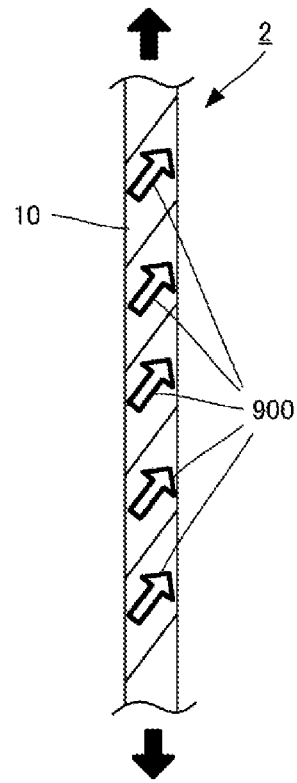
FIG. 7B is a view showing the piezoelectric yarn 2 when an external force is applied.

FIG. 7A is a view showing the piezoelectric yarn 1 when an external force is applied, and FIG. 7B is a view showing the piezoelectric yarn 2 when an external force is applied.

As shown in FIG. 5A, the piezoelectric yarn 1 is a left-twisted yarn (hereinafter referred to as S yarn) in which the piezoelectric film 10 is twisted around the core yarn 12 to the left. The stretching direction 900 is tilted at 45 degrees leftward with respect to the axial direction of the piezoelectric yarn 1. Therefore, as shown in FIG. 7A, when an external force is applied to the piezoelectric yarn 1, the piezoelectric film 10 becomes in the state as shown in FIG. 2A, which in turn generates a negative electric charge on its surface. Thus, the piezoelectric yarn 1 generates a negative electric charge on its surface when an external force is applied.

Further, as shown in FIG. 5B, the piezoelectric yarn 2 is a right-twisted yarn (hereinafter referred to as Z yarn) in which the piezoelectric film 10 is twisted around the core yarn 12 to the right. The stretching direction 900 is tilted at 45 degrees rightward with respect to the axial direction of the piezoelectric yarn 2. Therefore, as shown in FIG. 7B, when an external force is applied to the piezoelectric yarn 2, the piezoelectric film 10 becomes in the state as shown in FIG. 2B, which in turn generates a positive electric charge on its surface. Thus, the piezoelectric yarn 2 generates a negative electric charge on its surface when an external force is applied.

Figure 8:
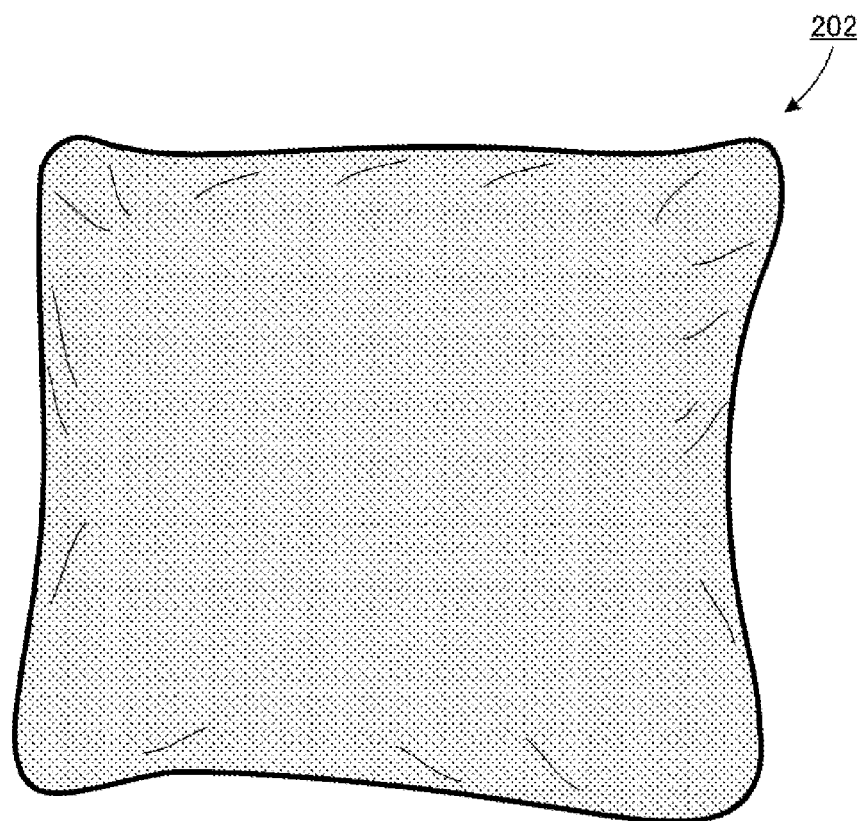
FIG. 8 is an outline view of a cushion 202 including the nonwoven member 102.

FIG. 8 is an outline view of a cushion 202 including the nonwoven member 102. The nonwoven member 102 is filled in the cushion 202.

Since the nonwoven member 102 produces an electric field by a piezoelectric effect, no power supply is required, and an electric shock may not occur. The life of the piezoelectric body lasts longer than the antibacterial effect of chemicals or the like. Further, the piezoelectric body may cause an allergic reaction less than chemicals. The nonwoven member 102 accidentally forms a circuit with the piezoelectric yarns 1 and 2 that form the nonwoven member itself, by intertwining these yarns, to thereby solely produce an electric field, or forms a current path in the presence of humidity to thereby flow an electric current. This exerts an antibacterial action and an antifungal action on the bacteria that migrate to the cushion 202 (nonwoven member 102). In particular, a cushion is inevitably stretched due to the movement such as reclining. Therefore, the nonwoven member 102 filled in the cushion generates an electric charge at a high frequency. In addition, the cushion absorbs moisture such as perspiration or the like to become a hotbed for growth of bacteria. The nonwoven member 102 is, however, capable of inhibiting the growth of bacteria (germs, fungi, etc.) and thus produces a remarkable effect as applications for antibacterial measure and measure against odor.

In the present embodiment, the piezoelectric film is shown as an example of the piezoelectric body. The piezoelectric body may, however, be a yarn discharged from a nozzle and then stretched (a piezoelectric yarn having a generally circular cross section or a piezoelectric yarn having a modified cross section). For example, a polylactic acid (PLLA) piezoelectric yarn may be prepared by melt spinning, high stretching, or heat treatment (for crystallization). Such a yarn (multifilament yarn) obtained by twisting a plurality of PLLA piezoelectric yarns may be formed. Even when a tension is applied to the multifilament yarn, the S yarn generates a negative electric charge on its surface and the Z yarn generates a positive electric charge on its surface. These yarns can be simply twisted without using a core yarn. The thus twisted yarn can be manufactured at a low cost. The number of filaments of the multifilament yarn is set in view of the uses of the yarn. The number of twists is also appropriately set. A filament which is not partially a piezoelectric body may be contained in the plurality of filaments. The thickness of the filaments may not be uniform. When the plurality of filaments do not have a uniform thickness, a potential distribution produced in the cross section of the yarn deviates to break symmetry. Therefore, an electric field circuit between the S yarn and the Z yarn is readily formed.

Although the present embodiment exemplifies a yarn obtained by twisting the piezoelectric film 10 around the core yarn 12, the core yarn 12 is not always required for both the S yarn and the Z yarn. Without the core yarn 12, it is possible to helically twist the piezoelectric film 10 to produce a piezoelectric yarn (twisted yarn). In the absence of the core yarn 12, the twisted yarn becomes hollow to improve heat retaining performance. Further, it is possible to increase the strength of the twisted yarn by impregnating the twisted yarn itself with an adhesive.

The piezoelectric yarn may be a yarn which generates an electric charge when an energy is applied thereto, and, for example, the above-mentioned PVDF or the like may be useful. The piezoelectric body having pyroelectricity such as PVDF generates an electric charge on its surface due to heat energy on a body surface of an animal. Thus, the piezoelectric body having pyroelectricity such as PVDF exerts an antibacterial effect. In the case of using PVDF, the piezoelectric body exerts an antibacterial effect without stretching the yarn as long as ambient temperature or body temperature changes. That is, the piezoelectric yarn of the present invention may be any piezoelectric body as long as the piezoelectric body generates an electric charge not only when the yarn is stretched but also when an external force is applied thereto. Instead of the piezoelectric yarn, the piezoelectric fiber 11 described in the first embodiment may be used.

The mixing ratio of the S yarn to the Z yarn may be 1:1, and even though the ratio is out of this, the effect as described above can be obtained. To the extent that a substance attraction effect is exerted, the nonwoven member may be made of either the S yarn or the Z yarn.

Further, any well-known method may be adopted as a method of manufacturing the piezoelectric yarn. The method that may be used include, for example, a method of extruding a piezoelectric polymer to form a fiber; a method of melt-spinning a piezoelectric polymer to form a fiber; a method of dry-spinning or wet-spinning a piezoelectric polymer to form a fiber; a method of electrostatic spinning a piezoelectric polymer to form a fiber; or the like.

Third Embodiment

The third embodiment shows an example of the nonwoven member as a pellet for packaging materials.

Figure 9A:
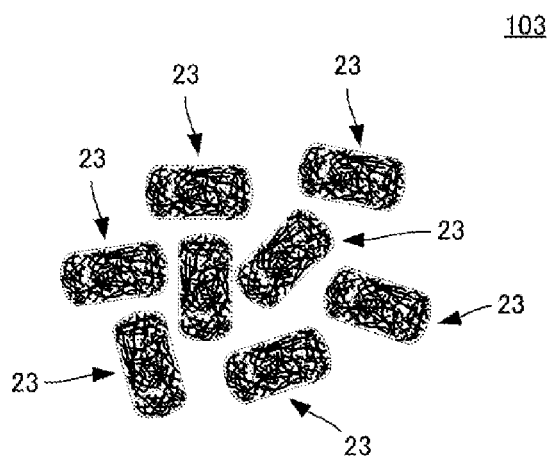
FIG. 9A is an outline view of a nonwoven member 103 according to a third embodiment.
Figure 9B:
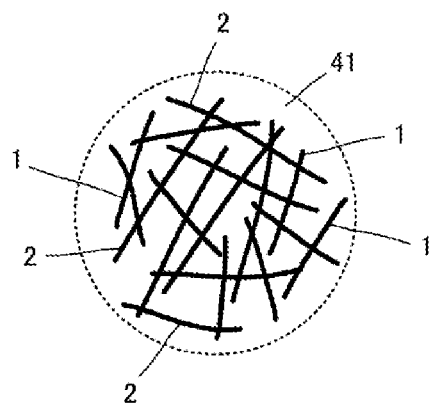
FIG. 9B is an enlarged view of a mass 23 including the nonwoven member 103.

FIG. 9A is an outline view of a nonwoven member 103 according to a third embodiment, and FIG. 9B is an enlarged view of a mass 23 included in the nonwoven member 103.

The nonwoven member 103 includes a mass 23 containing a piezoelectric body. The mass 23 is composed of a piezoelectric yarn 1 and a piezoelectric yarn 2, and a foam 41. As shown in FIG. 9B, the mass 23 is a cushioning material in which the piezoelectric yarns 1 and 2 are cut into short lengths and the short pieces are mixed with the foam 41. The piezoelectric yarns 1 and 2 are the same as those described in the second embodiment. Instead of the above piezoelectric yarns, the ribbon film made from a piezoelectric body described in the first embodiment may be used. The foam 41 is, for example, foamed polypropylene. The nonwoven member 103 according to this embodiment is, for example, a buffer material (pellet) for packaging materials.

The nonwoven member 103 solely produces an electric field with the piezoelectric yarns 1 and 2 that form the nonwoven member itself. This exerts an antibacterial action and an antifungal action on the bacteria that migrate to the nonwoven member 102. In particular, the buffer material for packaging materials is inevitably stretched due to the movement of articles to be protected during traveling. Therefore, the nonwoven member 103 generates an electric charge at a high frequency. Therefore, it produces a remarkable effect as applications for antibacterial measure and antifungal measure.

Fourth Embodiment

The fourth embodiment shows a different example of the buffer material (nonwoven member) shown in the third embodiment.

Figure 10:
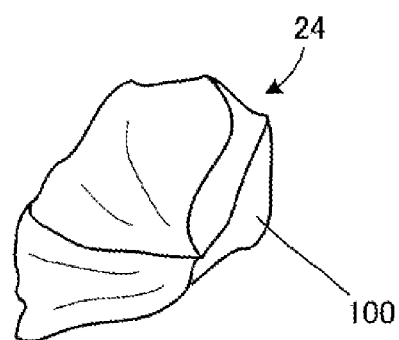
FIG. 10 is an outline view of a nonwoven member 104 according to a fourth embodiment.
Figure 11A:
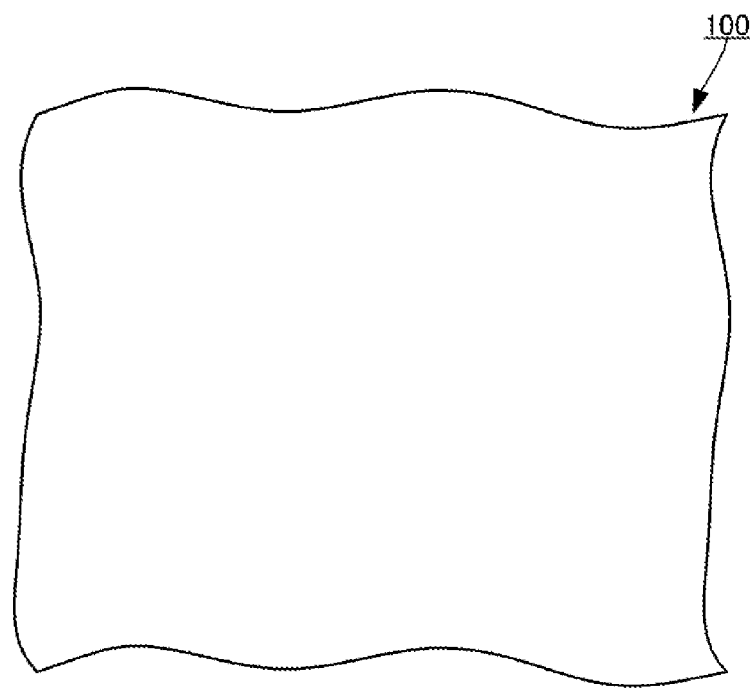
FIG. 11A is a plan schematic view of a cloth 100 including the nonwoven member 104.

FIG. 10 is an outline view of a nonwoven member 104 according to a fourth embodiment. FIG. 11A is a plan schematic view of a cloth 100 included in the nonwoven member 104, and FIG. 11B is a view showing electric fields generated between the yarns when an external force is applied to the cloth 100.

The nonwoven member 104 includes a mass 24 containing a piezoelectric body. The nonwoven member 104 according to this embodiment is, for example, a buffer material (pellet) for packaging materials.

The mass 24 is obtained by rounding the cloth 100 shown in FIG. 11A into a ball shape. The cloth 100 is woven of the piezoelectric yarn 1 made from a piezoelectric body, the piezoelectric yarn 2 made from a piezoelectric body, and an ordinary yarn 3. The ordinary yarn 3 is a yarn which is not provided with a piezoelectric body and is equivalent to a dielectric. The piezoelectric yarns 1 and 2 are the same as those described in the second embodiment.

Figure 11B:
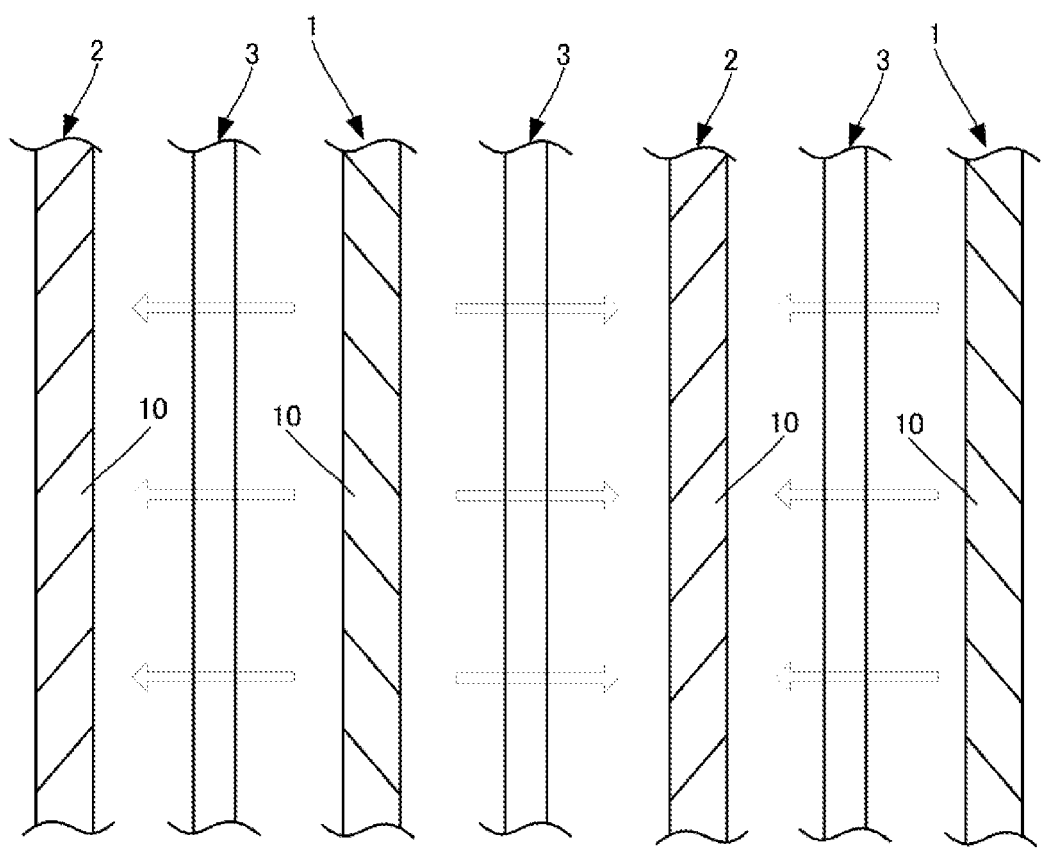
FIG. 11B is a view showing electric fields generated between the yarns when an external force is applied to the cloth 100.

As shown in FIG. 11B, the piezoelectric yarn 1, the piezoelectric yarn 2, and the ordinary yarn 3 are arranged in parallel. Each of the piezoelectric yarns 1 and 2 is arranged at a predetermined spaced interval with the ordinary yarn 3, which is equivalent to a dielectric, being interposed between the piezoelectric yarns.

The piezoelectric yarn 1 (S yarn) generates a negative electric charge on its surface when an external force is applied (when pulled in the axial direction). The piezoelectric yarn 2 (Z yarn) generates a positive electric charge on its surface when an external force is applied (when pulled in the axial direction). When the piezoelectric yarns 1 and 2 come close to each other, the close portions (surfaces of the piezoelectric yarns) tend to have the same potential. On the other hand, portions equivalent to cores of the piezoelectric yarns show a potential that opposes that on the surfaces of the piezoelectric yarns, while maintaining the original potential difference. Therefore, an electric field directed from the core of the yarn to the outside of the yarn is formed in proximity (surrounding space) to the piezoelectric yarn 1, and an electric field directed from the outside of the yarn to the core of the yarn is formed in proximity (surrounding space) of the piezoelectric yarn 2. As a result of combining these electric fields, an electric field directed from the piezoelectric yarn 1 to the piezoelectric yarn 2 is formed between the piezoelectric yarns 1 and 2.

The piezoelectric yarn 1, the piezoelectric yarn 2, and the ordinary yarn 3 are arranged very close to each other, with almost no distance therebetween. These yarns are complicatedly intertwined to form a circuit at a local portion, and an electric field is produced between the yarns by a piezoelectric effect. The strength of the electric field increases in inverse proportion to the distance between substances which generate an electric charge as represented as $E=V/d$. The strength of the electric field produced by the cloth 100 thus results in a very large value. Such an electric field is formed by mutually combining the electric field generated inside and outside the piezoelectric yarn 1 with the electric field generated inside and outside the piezoelectric yarn 2. In some circumstances, a circuit may be formed as an actual current path due to moisture containing an electrolyte such as perspiration. In a fiber knitted cloth, fibers are complicatedly intertwined, so that an electric field generated in one portion of the piezoelectric yarn 1 and an electric field generated in the other portion thereof may be mutually combined. Similarly, an electric field generated in one portion of the piezoelectric yarn 2 and an electric field generated in the other portion thereof may be mutually combined. Even in the case where the strength of the electric field is macroscopically none or very weak, strong electric fields having conflicting vector directions may be microscopically assembled. These phenomena may be similarly described with a cloth formed of the piezoelectric yarn 1 alone, a cloth formed of the piezoelectric yarn 2 alone, or a cloth in which an ordinary yarn or a conductive yarn is knitted together with these clothes.

It should be noted that an electric field is not formed in the following example. WO 2015/159832 discloses a transducer which senses a displacement applied to a knitted or woven fabric using a plurality of piezoelectric yarns and conductive yarns. In the transducer, all the conductive yarns are connected to a detection circuit and a conductive yarn always pairs with a piezoelectric yarn. When an electric charge is generated in the piezoelectric yarn, an electron migrates from the conductive yarn to immediately neutralize the generated electric charge. In the transducer, the detection circuit detects an electric current generated due to the migration of the electron and then outputs as a signal. Accordingly, the transducer immediately cancels the generated potential, so that no strong electric field is formed between the piezoelectric yarn and the conductive yarn, and the piezoelectric yarn and the piezoelectric yarn.

As described above, conventionally, there has been known that an electric field can inhibit the growth of bacteria. It is therefore considered that the cloth 100 exerts an antibacterial effect by the electric field generated by itself and variation in its strength. Alternatively, the cloth 100 exerts an antibacterial or sterilizing effect by radical species generated by the action of the electric current or voltage. The cloth 100 solely produces an electric field with the piezoelectric yarns 1 and 2 that form the cloth itself. This exerts an antibacterial action and an antifungal action on the bacteria that migrate to the nonwoven member 104.

As described above, the piezoelectric yarn 1 generates a negative electric charge when an external force is applied. The piezoelectric yarn 2 generates a positive electric charge when an external force is applied. Therefore, the piezoelectric yarn 1 attracts a substance having a positive electric charge (e.g., particles such as pollen) and the piezoelectric yarn 2 attracts a substance having a negative electric charge (e.g., harmful substances such as yellow dust). Accordingly, it is possible for the cloth 100 including the piezoelectric yarn 1 or 2 to attract fine particles such as pollen or yellow dust.

Figure 12A:
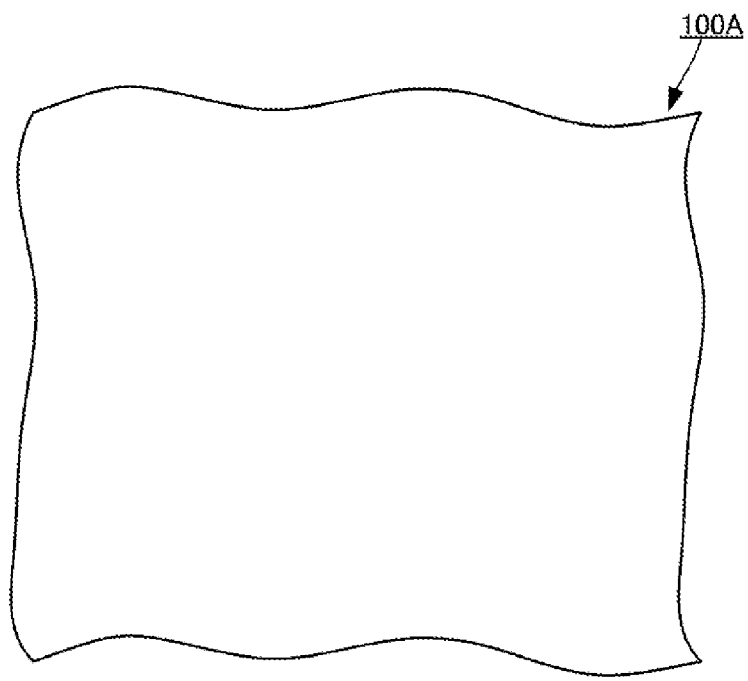
FIG. 12A is a plan schematic view of another cloth 100A according to the fourth embodiment.

The cloth forming the mass of the present invention may have the following configuration. FIG. 12A is a plan schematic view of another cloth 100A according to the fourth embodiment, and FIG. 12B is a view showing electric fields between the yarns.

Figure 12B:
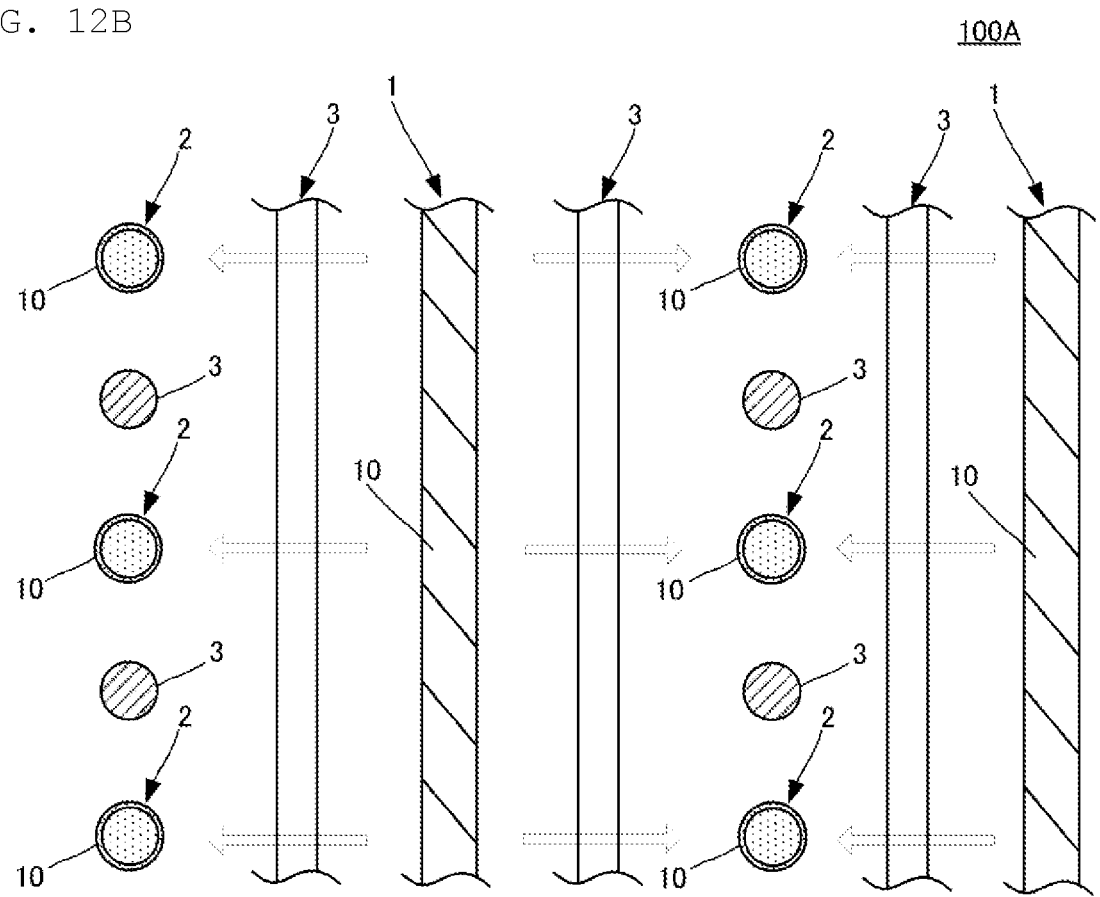
FIG. 12B is a view showing electric fields between the yarns.

As shown in FIG. 12B, the cloth 100A has the piezoelectric yarn 1, the piezoelectric yarn 2, and the ordinary yarn 3 arranged in crossed relation. Even such a configuration is likely to generate an electric field at a location where the piezoelectric yarns 1 and 2 are crossed.

The present embodiment exemplifies that the mass 24 is obtained by rounding the cloth 100 into a ball shape. However, the present invention is not limited to this configuration. The mass of the present invention may be, for example, a piece of cloth obtained by simply cutting the cloth 100 into small pieces and not necessarily have a ball shape.

The present embodiment exemplifies that the mass 24 is formed of the cloth 100. However, the present invention is not limited to this configuration. The cloth which forms the mass of the present invention may be a nonwoven fabric in which piezoelectric fibers are not woven but intertwined into a sheet.

Most of the bacteria have a negative electric charge. For this reason, the piezoelectric yarn 2 allows most of the bacteria to attract with the positive electric charge generated when an external force is applied. Also, it is possible to inactivate bacteria having a negative electric charge by using a cloth woven of the piezoelectric yarn 2 in the mass of the present invention.

The present embodiment exemplifies the case where the cloth 100 is formed by combining the S yarn and the Z yarn both made of the same polylactic acid (e.g., PLLA). The same effect is, however, exerted, for example, when an S yarn made of PLLA and an S yarn made of PDLA are combined. In addition, even when a Z yarn made of PLLA and a Z yarn made of PDLA are combined, the same effect is exerted.

Fifth Embodiment

The fifth embodiment shows an example of the buffer material different from those in the second, third, and fourth embodiments.

Figure 13:
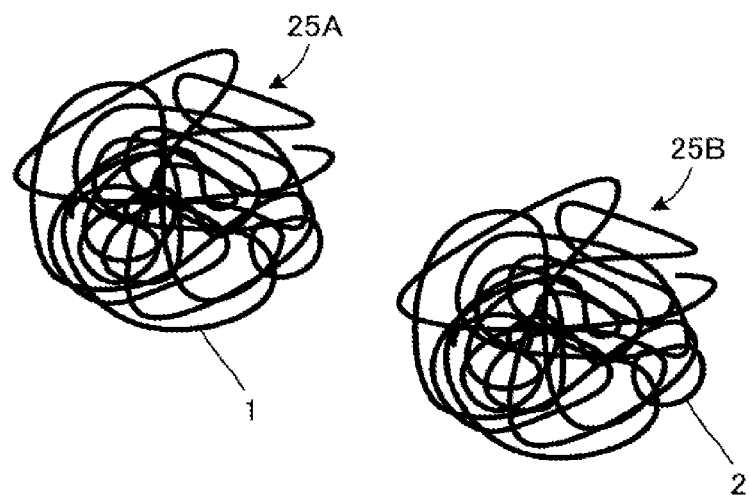
FIG. 13 is an outline view of a nonwoven member 105 according to a fifth embodiment.

FIG. 13 is an outline view of a nonwoven member 105 according to a fifth embodiment.

Figure 14A:
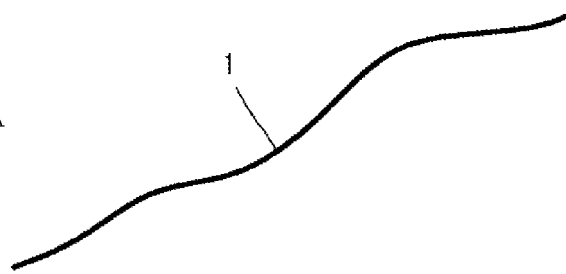
FIG. 14A is an outline view of the piezoelectric yarn 1 which forms a mass 25A and FIG. 14B is an outline view of the piezoelectric yarn 1 which forms a mass 25B.
Figure 14B:
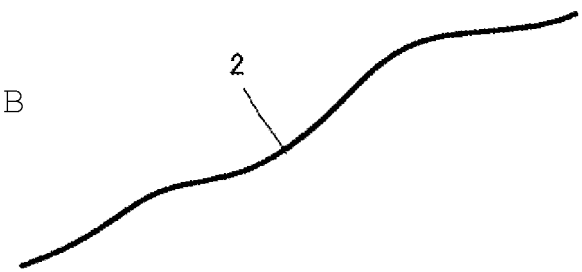

FIG. 14A is an outline view of the piezoelectric yarn 1 which forms a mass 25A and FIG. 14B is an outline view of the piezoelectric yarn 1 which forms a mass 25B.

The nonwoven member 105 includes masses 25A and 25B each containing a piezoelectric body. The nonwoven member 105 according to the present embodiment is, for example, a buffer material (pellet) for packaging materials.

The mass 25A is obtained by rounding the piezoelectric yarn 1 shown in FIG. 14A into a ball shape. The mass 25B is obtained by rounding the piezoelectric yarn 2 shown in FIG. 14B into a ball shape. The piezoelectric yarns 1 and 2 are the same as those described in the second embodiment.

The piezoelectric yarn 1 generates a negative electric charge on its surface when an external force is applied (when pulled in the axial direction). The piezoelectric yarn 2 generates a positive electric charge on its surface when an external force is applied (when pulled in the axial direction). Therefore, when an external force is applied to these yarns, an electric field is produced between the mass 25B (piezoelectric yarn 2) that generates a positive electric charge and the mass 25A (piezoelectric yarn 1) that generates a negative electric charge. As described above, the electric fields in the portions where the piezoelectric yarns 1 and 2 are close to each other tend to have the same potential, and an electric field from the piezoelectric yarn 1 to the piezoelectric yarn 2 is primarily formed. That is, the nonwoven member 105 produces an electric field with the masses 25A (piezoelectric yarn 1) and 25B (piezoelectric yarn 2) that form the nonwoven member itself. This exerts an antibacterial action and an antifungal action on the bacteria that migrate to the nonwoven member 105.

The present embodiment exemplifies the nonwoven member 105 including the masses 25A and 25B that round piezoelectric yarns 1 and 2, respectively, into a ball shape. However, the present invention is not limited to this configuration. For example, the mass of the present invention may have a ball shape formed by intertwining the piezoelectric yarns 1 and 2 each other. The nonwoven member may also be a lint obtained by simply cutting the piezoelectric yarns 1 and 2 into short lengths, and not necessarily have a ball shape. Further, the nonwoven member may be a mixture of the lint obtained by simply cutting the piezoelectric yarns 1 and 2 into short lengths with the piece of cloth obtained by simply cutting the cloth 100 into small pieces as shown in the fifth embodiment. Instead of the piezoelectric yarn, the piezoelectric fiber 11 (ribbon film) described in the first embodiment may be used.

Sixth Embodiment

The sixth embodiment shows an example of the nonwoven member in which the shape of the mass is different from those in the preceding embodiments.

Figure 15A:
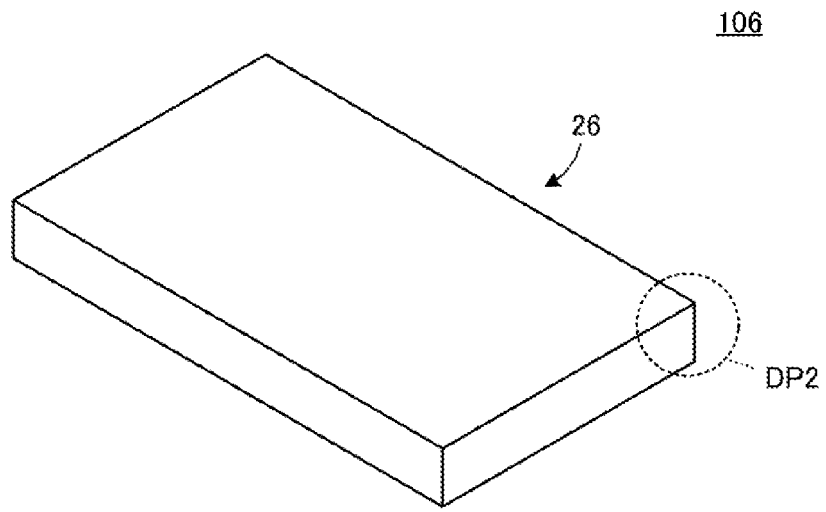
FIG. 15A is an outline view of a nonwoven member 106 according to a sixth embodiment and FIG. 15B is an enlarged view of a DP2 portion shown in FIG. 15A.
Figure 15B:
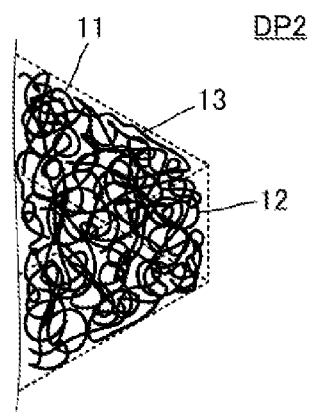

FIG. 15A is an outline view of a nonwoven member 106 according to a sixth embodiment and FIG. 15B is an enlarged view of a DP2 portion shown in FIG. 15A.

The nonwoven member 106 includes a mass 26 containing a piezoelectric body. The mass 26 is composed of a piezoelectric fiber 11 and a resin fiber 13. As shown in FIG. 15B, the mass 26 is a buffer material obtained by intertwining the piezoelectric fiber 11 and the resin fiber 13 each other and solidifying them. The piezoelectric fiber 11 is the same as the one described in the first embodiment. The resin fiber 13 is, for example, a polyester fiber. The nonwoven member 106 according to this embodiment is, for example, a mattress material for bed.

The nonwoven member 106 produces an electric field between the nonwoven member and a human body due to the piezoelectric fiber 11 that forms the nonwoven member itself when an external force is applied. This exerts an antibacterial action and an antifungal action on the bacteria that migrate to the nonwoven member 106. In particular, the mattress for bed is inevitably stretched due to the movement of a human body during sleeping. Therefore, the piezoelectric fiber 11 generates an electric charge at a high frequency. In addition, the mattress for bed comes in contact with moisture such as perspiration or the like to become a hotbed for growth of bacteria. The nonwoven member 106 is, however, capable of inhibiting the growth of bacteria and thus produces a remarkable effect as applications for antibacterial measure, antifungal measure, and measure against odor.

When a human lies on a bed including the above-mentioned mattress, the nonwoven member 106 is positioned close to a human skin, so that an electric field is generated between the human skin and the nonwoven member 106 due to application of an external force to the nonwoven member 106. Therefore, since an electric field is generated between the human skin and the nonwoven member 106 in the case where a human lies on the bed, an antibacterial effect and a mildew proofing effect are also exerted on an object (e.g., sheets, etc.) positioned between the human and the nonwoven member 106.

The present embodiment exemplifies the mass formed by intertwining the piezoelectric fiber and the resin fiber and solidifying them. However, the mass of the present invention is not limited to this configuration. The mass of the present invention may be formed by intertwining a piezoelectric yarn and a resin fiber and solidifying them. The mass of the present invention may be formed by mixing a piezoelectric fiber (or piezoelectric yarn) with a foam.

Seventh Embodiment

The seventh embodiment shows a different example of the yarns shown in the preceding embodiments.

Figure 16A:
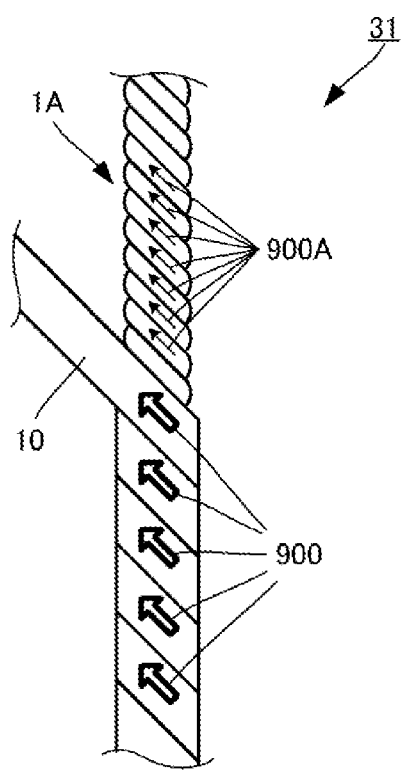
FIG. 16A is a partially exploded view showing a configuration of a piezoelectric yarn 31 and FIG. 16B is a partially exploded view showing a configuration of a piezoelectric yarn 32.
Figure 16B:
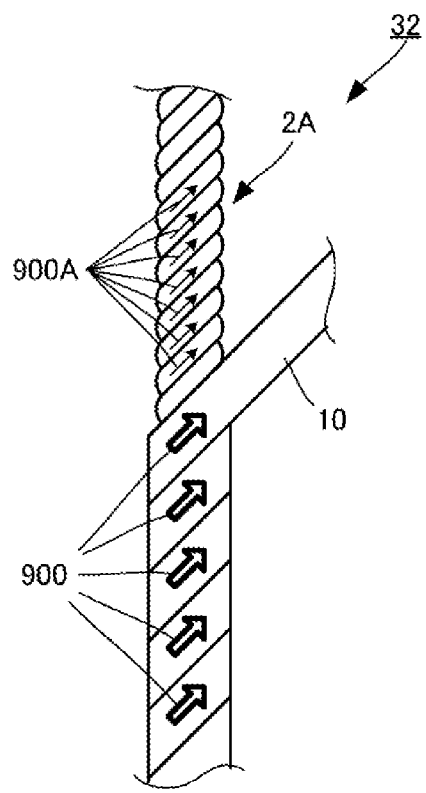

FIG. 16A is a partially exploded view showing a configuration of a piezoelectric yarn 31 and FIG. 16B is a partially exploded view showing a configuration of a piezoelectric yarn 32.

The piezoelectric yarn 31 is obtained by further winding the piezoelectric film 10 on a piezoelectric covering yarn 1A, which is an S yarn. The piezoelectric yarn 32 is obtained by further winding the piezoelectric film 10 on a piezoelectric covering yarn 2A, which is a Z yarn.

As shown in FIG. 16A, the piezoelectric yarn 31 is a left-twisted yarn (S yarn) in which the piezoelectric film 10 is twisted to the left to cover the piezoelectric covering yarn 1A. The stretching direction 900 is tilted at 45 degrees leftward with respect to the axial direction of the piezoelectric yarn 31. The stretching direction 900 is in line with a stretching direction 900A of the piezoelectric covering yarn 1A.

When the piezoelectric yarn 31 is pulled in the axial direction (when an external force is applied), a negative electric charge is generated on the surface of the piezoelectric covering yarn 1A. On the other hand, a positive electric charge is generated on the rear surface of the piezoelectric film 10 that is opposed to the surface of the piezoelectric covering yarn 1A. When the surface of the piezoelectric covering yarn 1A and the rear surface of the piezoelectric film 10 are completely in contact with each other, the contact portions have the same potential. However, when a potential difference is defined in a clearance accidentally generated due to stretching of the yarn or the like, an electric field is produced in the clearance. The potential difference at each point is defined by an electric field coupling circuit formed by complicatedly intertwining yarns, or a circuit formed by a current path which is accidentally formed in the yarn due to moisture or the like. When the circuit is formed, the strength of the electric field increases in inversely proportion to the distance between substances which generate electric charges. Therefore, the strength of the electric field produced between the surface of the piezoelectric covering yarn 1A and the rear surface of the piezoelectric film 10 may be extremely increased. That is, this configuration further enhances an antibacterial effect or a sterilizing effect of the yarn itself. When the piezoelectric yarn 31 is pulled in the axial direction (when an external force is applied), a negative electric charge is generated on the surface of the piezoelectric yarn 31 (the surface of the piezoelectric film 10). Therefore, it is possible to further generate an electric field between the yarns by combining the piezoelectric yarn 31 with a yarn of which a positive electric charge is generated on its surface (the piezoelectric yarn 32 to be described later).

As shown in FIG. 16B, the piezoelectric yarn 32 is a right-twisted yarn (Z yarn) in which the piezoelectric film 10 is twisted to the right to cover the piezoelectric covering yarn 2A. The stretching direction 900 is tilted at 45 degrees rightward with respect to the axial direction of the piezoelectric yarn 32. The stretching direction 900 is in line with the stretching direction 900A of the piezoelectric covering yarn 2A.

When the piezoelectric yarn 32 is pulled in the axial direction (when an external force is applied), a positive electric charge is generated on the surface of the piezoelectric covering yarn 2A (the surface of the piezoelectric film 10). On the other hand, a negative electric charge is generated on the rear surface of the piezoelectric film 10 that is opposed to the surface of the piezoelectric covering yarn 2A. When the surface of the piezoelectric covering yarn 2A and the rear surface of the piezoelectric film 10 are completely in contact with each other, the contact portions have the same potential. However, when a potential difference is defined in a clearance accidentally generated due to stretching of the yarn or the like, an electric field is produced in the clearance. The potential difference at each point is defined by an electric field coupling circuit formed by complicatedly intertwining yarns, or a circuit formed by a current path which is accidentally formed in the yarn due to moisture or the like. When the circuit is formed, the strength of the electric field increases in inversely proportion to the distance between substances which generate electric charges. Therefore, the strength of the electric field produced between the surface of the piezoelectric covering yarn 2A and the rear surface of the piezoelectric film 10 may be extremely increased. That is, as in the case with the piezoelectric yarn 31, this configuration further enhances an antibacterial effect or a sterilizing effect of the yarn itself. When the piezoelectric yarn 32 is pulled in the axial direction (when an external force is applied), a positive electric charge is generated on the surface of the piezoelectric yarn 32 (the surface of the piezoelectric film 10). Therefore, it is possible to generate an electric field between the yarns by combining the piezoelectric yarn 32 with a yarn of which a negative electric charge is generated on its surface like the piezoelectric yarn 31.

Figure 17A:
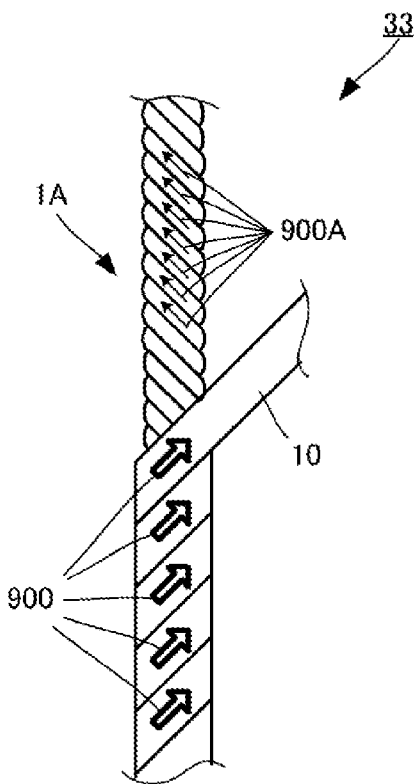
FIG. 17A is a partially exploded view showing a configuration of a piezoelectric yarn 33 and FIG. 17B is a partially exploded view showing a configuration of a piezoelectric yarn 34.

The yarn of the present invention may have the following configuration. FIG. 17A is a partially exploded view showing a configuration of a piezoelectric yarn 33 and FIG. 17B is a partially exploded view showing a configuration of a piezoelectric yarn 34.

The piezoelectric yarn 33 is obtained by winding the piezoelectric film 10 on the piezoelectric covering yarn 1A. The piezoelectric yarn 34 is obtained by winding the piezoelectric film 10 around the piezoelectric covering yarn 2A.

As shown in FIG. 17A, the piezoelectric yarn 33 is a right-twisted yarn (Z yarn) in which the piezoelectric film 10 is twisted to the right to cover the piezoelectric covering yarn 1A. The stretching direction 900 is tilted at 45 degrees rightward with respect to the axial direction of the piezoelectric yarn 33. The stretching direction 900 is different from the stretching direction 900A of the piezoelectric covering yarn 1A.

Figure 17B:
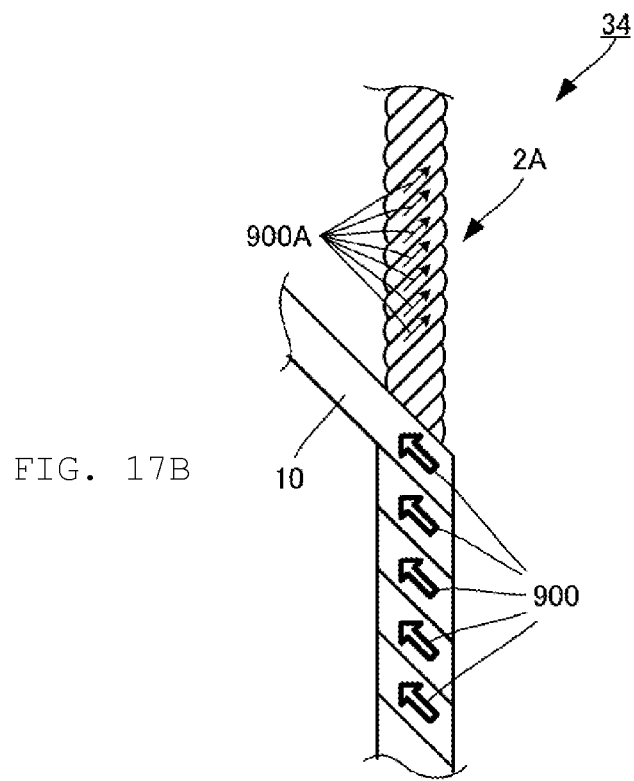

As shown in FIG. 17B, the piezoelectric yarn 34 is a left-twisted yarn (S yarn) in which the piezoelectric film 10 is twisted to the left to cover the piezoelectric covering yarn 2A. The stretching direction 900 is tilted at 45 degrees leftward with respect to the axial direction of the piezoelectric yarn 34. The stretching direction 900 is different from the stretching direction 900A of the piezoelectric covering yarn 2A.

Figure 18:
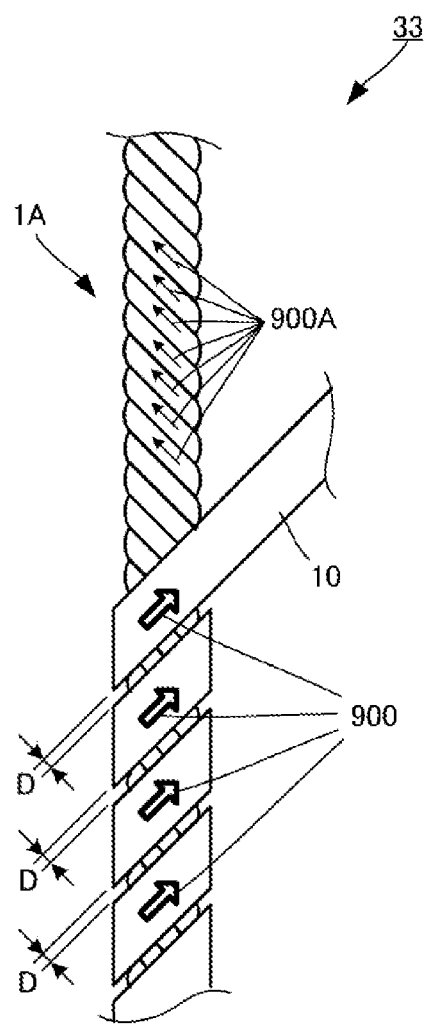
FIG. 18 is an exaggerated view showing clearances of the piezoelectric film 10 in the piezoelectric yarn 33.

FIG. 18 is an exaggerated view showing clearances of the piezoelectric film 10 in the piezoelectric yarn 33. The piezoelectric yarn 33 generates a certain degree of clearance D in the case of winding the piezoelectric film 10 around the covering yarn. The clearance D produces an electric field between the surface of the piezoelectric covering yarn 1A and the surface of the piezoelectric film 10 when the piezoelectric yarn 33 is pulled in the axial direction. Thus, this configuration further enhances an antibacterial effect or an antifungal effect of the yarn itself. The same applies to the piezoelectric yarn 34.

In the piezoelectric yarn 33, when PDLA is used in either the piezoelectric covering yarn 1A or the piezoelectric film 10, the electric charge generated on the surface of the piezoelectric covering yarn 1A and the electric charge generated on the rear surface of the piezoelectric film 10 have different polarities, so that the piezoelectric yarn 33 is formed in the same manner as the piezoelectric yarn 31, thereby producing a strong electric field between the surface of the piezoelectric covering yarn 1A and the rear surface of the piezoelectric film 10. The same applies to the piezoelectric yarn 34 when PDLA is used in either the piezoelectric covering yarn 2A or the piezoelectric film 10.

Figure 19:
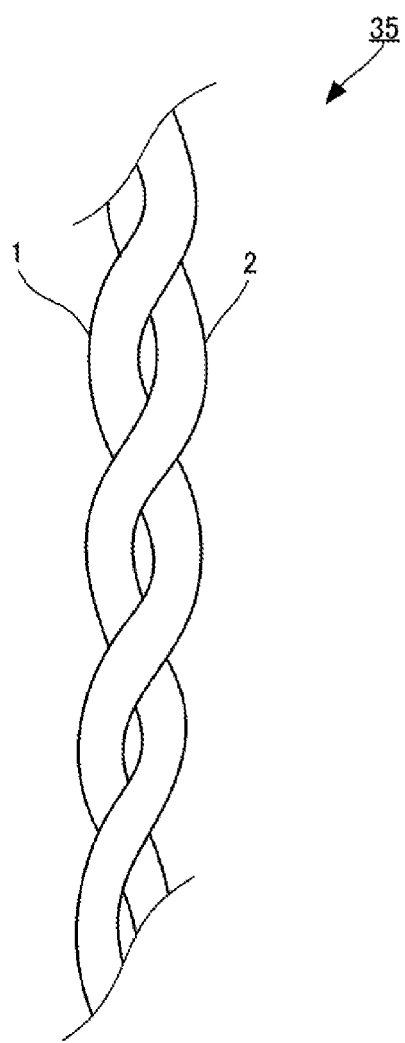
FIG. 19 is a partially exploded view showing a configuration of a piezoelectric yarn 35.

Further, the yarn of the present invention may have the following configuration. FIG. 19 is a partially exploded view showing a configuration of a piezoelectric yarn 35.

The piezoelectric yarn 35 is a yarn (S yarn) in which the piezoelectric yarns 1 and 2 are twisted around each other to the left. Since the piezoelectric yarn 35 is formed by intersecting the piezoelectric yarn 1 that generates a negative electric charge on its surface with the piezoelectric yarn 2 that generates a positive electric charge on its surface, the yarn can solely produce an electric field. As described above, the potentials generated on the respective surfaces of the piezoelectric yarns 1 and 2 tend to become equal at the portions where the surfaces of the piezoelectric yarns 1 and 2 are close to each other. Accordingly, the potential in the yarn varies to try to keep a potential difference between the surface and the inside of the yarn. Regarding the yarns, electric fields formed between the inside and the surface of the yarn are leaked out into air and then combined to form a strong electric field in the portions where the piezoelectric yarns 1 and 2 are close to each other. The twisted yarn has a complicated structure and is not uniform at the portions where the piezoelectric yarns 1 and 2 are close to each other. Further, when a tension is applied to the piezoelectric yarns 1 and 2, such close portions thereof also vary. Thus, the strength of the electric field at each of the portions varies, which in turn generates an electric field circuit where its symmetry is broken. Since a yarn (Z yarn) in which the piezoelectric yarns 1 and 2 are twisted around each other to the right is also formed by intersecting the piezoelectric yarn 1 that generates a negative electric charge on its surface with the piezoelectric yarn 2 that generates a positive electric charge on its surface, the yarn can solely produce an electric field. The number of twists in the piezoelectric yarn 1 and the number of twists in the piezoelectric yarn 2, or the number of twists in the piezoelectric yarn 35 made by twisting these yarns is determined in view of the antibacterial effect. All the preceding applications can be formed using the piezoelectric yarn 35. Since a yarn (Z yarn) in which the piezoelectric yarns 1 and 2 are twisted around each other to the right is also formed by intersecting the piezoelectric yarn 1 that generates a negative electric charge on its surface with the piezoelectric yarn 2 that generates a positive electric charge on its surface, the yarn can solely produce an electric field.

In addition to this, even a triple-covering yarn in which an ordinary yarn is twisted on the side surface of the S yarn (or Z yarn) and the Z yarn (or S yarn) is further twisted on its side surface can solely produce an electric field.

Figure 20:
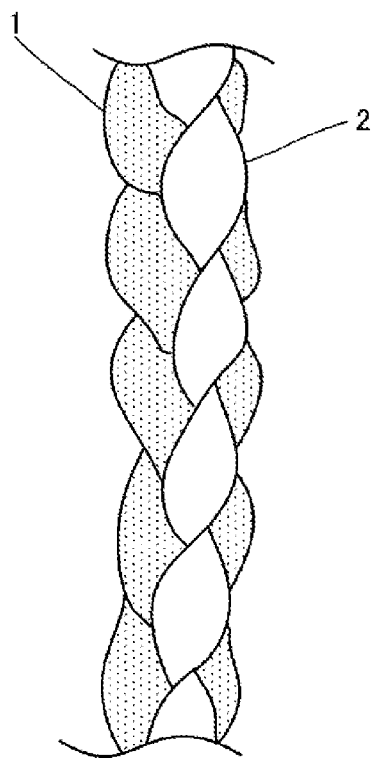
FIG. 20 is a view showing a configuration of a piezoelectric yarn 36.

The yarn of the present invention may be a yarn (third yarn) made of a braid which simultaneously forms the piezoelectric yarn 1 twisted to the right and the piezoelectric yarn 2 twisted to the left around the surface of the ordinary yarn, like the piezoelectric yarn 36 shown in FIG. 20. FIG. 20 is a view showing a configuration of a piezoelectric yarn 36. As shown in FIG. 20, even such a configuration produces an electric field at a position where the piezoelectric yarns 1 and 2 are crossed, so that the yarn can solely produce an electric field.

As the yarn that generates a negative electric charge on its surface, a Z yarn using PDLA as well as an S yarn using PLLA is considered. In addition, as the yarn that generates a positive electric charge on its surface, an S yarn using PDLA as well as a Z yarn using PLLA is considered. Therefore, for example, in the configuration shown in FIG. 14, a piezoelectric yarn made of a yarn (S yarn) obtained by twisting the S yarn using PLLA and the Z yarn using PDLA around each other to the left, or a yarn (Z yarn) obtained by twisting those yarns to the right can solely produce an electric field.

Next, the antibacterial effect of the yarn made from a piezoelectric body will be described. The inventors of the present invention performed quantitative tests shown in the following (1) and (2) in order to evaluate the bacteria inhibitory effect of the cloth woven of yarns made from a piezoelectric body.

(1) Evaluation of Antibacterial Properties of a Cloth Woven of Yarns Made from a Piezoelectric Body a) Test method: Bacteria emulsion absorption method (JIS L1902)

b) Test bacteria: *Staphylococcus aureus* NBRC12732 c) Inoculum concentration: $1.4 \times 10^5$ (CFU/mL)

d) Standard cloth: Cloth woven of cotton yarns and cloth knitted from cotton yarns e) Test sample (antibacterial-finished sample): Cloth knitted from S yarn (piezoelectric yarn 35) obtained by twisting an S yarn (piezoelectric yarn 1) and a Z yarn (piezoelectric yarn 2) around each other to the left Growth value: $G = Mb - Ma$ Antibacterial activity value: $A = (Mb - Ma) - (Mc - Mo)$
[Calculating Formula]

General antibacterial-finished products have an antibacterial activity value in the range of $A \geq 2.0$ to 2.2.

Ma: The arithmetical mean common logarithm for the viable cell count (or ATP amount) obtained from three test samples of the standard cloth immediately after inoculation of test bacteria Mb: The arithmetic mean common logarithm for the viable cell count (or ATP amount) obtained from three test samples of the standard cloth after 18-24 hour cultivation Mo: The arithmetical mean common logarithm for the viable cell count (or ATP amount) obtained from three test samples (antibacterial-finished samples) immediately after inoculation of test bacteria Mc: The arithmetical mean common logarithm for the viable cell count (or ATP amount) obtained from three test samples (antibacterial-finished samples) after 18-24 hour cultivation

TABLE 1

| Sample | | Arithmetical mean common logarithm for the viable cell count | Growth value G | Antibacterial activity value A |
|---|---|---|---|---|
| 1. Standard cloth (cotton, woven) | Immediately after inoculation | Ma = 4.35 | 2.5 | |
| | After 18-hour cultivation | Mb = 6.83 | | |
| 2. Standard cloth (cotton, knitted) | Immediately after inoculation | Mo = 4.42 | 3.0 | Standard cloth as a reference |
| | (Allowed to stand) after 18-hour | Mc = 7.45 | | −0.5 |
| | (Vibrated) after 18-hour cultivation | Mc = 6.39 | 2.0 | 0.5 |
| 3. Test sample (cloth knitted from S-twisted yarn including an S yarn and a Z yarn) | Immediately after inoculation | Mo = 4.43 | 1.4 | 2 as a reference |
| | (Allowed to stand) after 18-hour | Mc = 5.80 | | 1.6 |
| | (Vibrated) after 18-hour cultivation | Mc = 1.30 | −3.1 | 5.1 |

It can be clearly seen from TABLE 1 that the test sample (cloth woven of yarns made from a piezoelectric body) has a higher antibacterial action on germs than the standard cloth. As compared to the state where the test sample is allowed to stand, the vibrated test sample has a higher antibacterial action. In particular, in the case where the test sample is vibrated to generate an electric field, little viable cells are observed 18 hours after inoculation of test bacteria (germs) and a high antibacterial action is exerted.

(2) Evaluation of Antifungal Properties of a Cloth Woven of Yarns Made from a Piezoelectric Body a) Test method: Antifungal quantitative test method (procedure specified by Japan Textile Evaluation Technology Council (JTETC)

b) Test bacteria: *Aspergillus niger* NBRC105649 c) Inoculum concentration: $1.1 \times 10^5$ (CFU/mL)

d) Standard cloth: Cloth woven of cotton yarns and cloth knitted from cotton yarns e) Test sample (antibacterial-finished sample) Cloth knitted from S yarn (piezoelectric yarn 35) obtained by twisting an S yarn (piezoelectric yarn 1) and a Z yarn (piezoelectric yarn 2) around each other to the left Development value: $F=Fb-Fa$ Antifungal activity value: $FS=(Fb-Fa)-(Fc-Fo)$
[Calculating Formula]

Fa: The arithmetical mean common logarithm for the viable cell count (or ATP amount) obtained from three test samples of the standard cloth immediately after inoculation of test bacteria Fb: The arithmetical mean common logarithm for the viable cell count (or ATP amount) obtained from three test samples of the standard cloth after 42-hour cultivation Fo: The arithmetical mean common logarithm for the viable cell count (or ATP amount) obtained from three test samples (antibacterial-finished samples) immediately after inoculation of test bacteria Fc: The arithmetical mean common logarithm for the viable cell count (or ATP amount) obtained from three test samples (antibacterial-finished samples) after 42-hour cultivation

TABLE 2

| Sample | | Arithmetical mean common logarithm for the viable cell count | Development value F | Antifungal activity value FS |
|---|---|---|---|---|
| 1. Standard cloth (cotton, woven) | Immediately after inoculation | Fa = −11.79 | 2.3 | |
| | After 42-hour cultivation | Fb = −9.50 | | |
| 2. Standard cloth (cotton, knitted) | Immediately after inoculation | Fo = −11.69 | 2.3 | Standard cloth as a reference 0.0 |
| | (Allowed to stand) after 42-hour | Fc = −9.39 | | |
| | (Vibrated) after 42-hour cultivation | Fc = −10.47 | 1.2 | 1.1 |
| 3. Test sample (cloth knitted from S-twisted yarn including an S yarn and a Z yarn) | Immediately after inoculation | Fo = −11.79 | 1.5 | 2 as a reference 0.7 |
| | (Allowed to stand) after 42-hour | Fc = −10.15 | | |
| | (Vibrated) after 42-hour cultivation | Fc = −12.67 | −1.0 | 2.2 |

It can be clearly seen from TABLE 2 that the test sample (cloth woven of yarns made from a piezoelectric body) has a higher antibacterial action on fungi (mold, etc.) than the standard cloth. As compared to the state where the test sample is allowed to stand, the vibrated test sample has a higher antifungal action. That is, the test sample exerts a high antifungal action when vibrated to produce an electric field.

The above results revealed that the cloth 100 woven of yarns made from a piezoelectric body has antibacterial properties and antifungal properties.

The embodiments described above should therefore be considered in all respects as illustrative and not restrictive. It will be apparent to those skilled in the art that various modifications and variations can be appropriately made. The scope of the invention is given by the appended claims, rather than the preceding embodiments, and all variations and equivalents which fall within the scope of the claims are intended to be embraced therein.

DESCRIPTION OF REFERENCE SYMBOLS

D: Clearance
1, 2: Piezoelectric yarn
1A, 2A: Piezoelectric covering yarn
3: Ordinary yarn
10: Piezoelectric film
11: Piezoelectric fiber
12: Core yarn
13: Resin fiber
22, 23, 24, 25A, 25B, 26: Mass
30: Cotton
31, 32, 33, 34, 35, 36: Piezoelectric yarn
41: Foam
50: Strap
100, 100A: Cloth
101, 102, 103, 104, 105, 106: Nonwoven member
201: Mask
202: Cushion
900, 900A: Stretching direction
910A: First diagonal line
910B: Second diagonal line

The invention claimed is:

1. An antibacterial material comprising:
a plurality of piezoelectric bodies arranged so as to generate electric charges when an external force of bending, stretching, and/or heating is applied to the plurality of piezoelectric bodies, the electric charges being sufficient to inhibit growth of bacteria,
wherein the plurality of piezoelectric bodies include a first yarn constructed to generate a positive electric charge when the external force is applied and a second yarn constructed to generate a negative electric charge when the external force is applied, and
wherein the antibacterial material does not include conductive yarns that are configured for connection to a detection circuit.

2. The antibacterial material according to claim 1, wherein the plurality of piezoelectric bodies are constructed from a piezoelectric polymer.

3. The antibacterial material according to claim 2, wherein the piezoelectric polymer contains polyactic acid.

4. The antibacterial material according to claim 1, wherein
the first yarn is a right-twisted yarn in which a first piezoelectric film is twisted around a first core yarn to the right, and a first stretching direction of the first piezoelectric film is oriented at a first angle with respect to an axial direction of the first yarn; and the second yarn is a left-twisted yarn in which a second piezoelectric film is twisted around a second core yarn to the left, and a second stretching direction of the second piezoelectric film is oriented at a second angle with respect to an axial direction of the second yarn.

5. The antibacterial material according to claim 4, wherein the first angle and the second angle are each 45 degrees.

6. An antibacterial nonwoven fabric formed of the antibacterial material as defined in claim 1, and configured as a cloth.

7. An antibacterial buffer material formed of the antibacterial material defined in claim 5.

8. An antibacterial material comprising:
a mass containing a piezoelectric body, the piezoelectric body generating an electric charge when an external force of bending, stretching, and/or heating is applied to the piezoelectric body, the electric charge being sufficient to inhibit growth of bacteria,
wherein the piezoelectric body includes a first yarn constructed to generate a positive electric charge when the external force is applied and a second yarn constructed to generate a negative electric charge when the external force is applied, and
wherein the antibacterial material does not include conductive yarns that are configured for connection to a detection circuit.

9. The antibacterial material according to claim 8, wherein at least a part of the mass is a cloth containing the first and second yarns.

10. The antibacterial material according to claim 8, wherein
the first yarn is a right-twisted yarn in which a first piezoelectric film is twisted around a first core yarn to the right, and a first stretching direction of the first piezoelectric film is oriented at a first angle with respect to an axial direction of the first yarn; and
the second yarn is a left-twisted yarn in which a second piezoelectric film is twisted around a second core yarn to the left, and a second stretching direction of the second piezoelectric film is oriented at a second angle with respect to an axial direction of the second yarn.

11. The antibacterial material according to claim 8, wherein the first yarn and the second yarn are arranged in parallel.

12. The antibacterial material according to claim 8, wherein the first yarn and the second yarn are arranged in a crossed relation.

13. The antibacterial material according to claim 8, further comprising a third yarn interlaced with the first yarn and the second yarn as a braid.

14. The antibacterial material according to claim 8, wherein the piezoelectric body is a piezoelectric polymer.

15. The antibacterial material according to claim 14, wherein the piezoelectric polymer contains polylactic acid.

16. The antibacterial material according to claim 8, wherein the piezoelectric body is a piezoelectric polymer, and configured into the yarns by twisting the piezoelectric polymer.

* * * * *